(12) United States Patent
Dehe et al.

(10) Patent No.: US 9,002,037 B2
(45) Date of Patent: *Apr. 7, 2015

(54) MEMS STRUCTURE WITH ADJUSTABLE VENTILATION OPENINGS

(75) Inventors: Alfons Dehe, Reutlingen (DE); Matthias Herrmann, Munich (DE); Ulrich Krumbein, Rosenheim (DE); Stefan Barzen, Munich (DE); Wolfgang Klein, Zorneding (DE); Wolfgang Friza, Villach (AT); Martin Wurzer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 368 days.

This patent is subject to a terminal disclaimer.

(21) Appl. No.: 13/531,373

(22) Filed: Jun. 22, 2012

(65) Prior Publication Data

US 2013/0223023 A1 Aug. 29, 2013

Related U.S. Application Data

(63) Continuation-in-part of application No. 13/408,971, filed on Feb. 29, 2012.

(51) Int. Cl.
| | | |
|---|---|---|
| *H04R 25/00* | (2006.01) | |
| *H04R 3/00* | (2006.01) | |
| *B81B 7/00* | (2006.01) | |
| *H04R 7/18* | (2006.01) | |
| *H04R 19/00* | (2006.01) | |

(52) U.S. Cl.
CPC ....... *B81B 7/0029* (2013.01); *B81B 2201/0257* (2013.01); *B81B 2203/0127* (2013.01); *H04R 7/18* (2013.01); *H04R 19/005* (2013.01); *H04R 2307/207* (2013.01)

(58) Field of Classification Search
USPC ........ 381/113, 174, 191; 257/416; 361/283.4; 438/53
See application file for complete search history.

(56) References Cited

U.S. PATENT DOCUMENTS

| | | |
|---|---|---|
| 5,146,435 A | 9/1992 | Bernstein |
| 5,452,268 A | 9/1995 | Bernstein |
| 6,075,867 A | 6/2000 | Bay et al. |
| 6,160,896 A | 12/2000 | Macaluso et al. |
| 6,549,635 B1 | 4/2003 | Gebert |
| 7,570,772 B2 | 8/2009 | Sorensen et al. |
| 2004/0259286 A1 | 12/2004 | Dehe et al. |
| 2005/0179100 A1 | 8/2005 | Barzen et al. |
| 2005/0185812 A1 | 8/2005 | Minervini |
| 2005/0207605 A1 | 9/2005 | Dehe et al. |
| 2005/0241944 A1 | 11/2005 | Dehe et al. |
| 2005/0262947 A1 | 12/2005 | Dehe |
| 2007/0034976 A1 | 2/2007 | Barzen et al. |
| 2008/0104825 A1 | 5/2008 | Dehe et al. |
| 2008/0218934 A1* | 9/2008 | Langereis et al. ......... 361/283.1 |
| 2008/0247573 A1 | 10/2008 | Pedersen |
| 2009/0162534 A1 | 6/2009 | Dehe et al. |
| 2009/0309174 A1 | 12/2009 | Fueldner et al. |
| 2010/0158281 A1 | 6/2010 | Lee et al. |
| 2010/0164025 A1 | 7/2010 | Yang |

(Continued)

*Primary Examiner* — Matthew Eason
(74) *Attorney, Agent, or Firm* — Slater & Matsil, L.L.P.

(57) ABSTRACT

A MEMS structure includes a backplate, a membrane, and an adjustable ventilation opening configured to reduce a pressure difference between a first space contacting the membrane and a second space contacting an opposite side of the membrane. The adjustable ventilation opening is passively actuated as a function of the pressure difference between the first space and the second space.

30 Claims, 18 Drawing Sheets

(56) References Cited

U.S. PATENT DOCUMENTS

| | | | |
|---|---|---|---|
| 2011/0110550 A1* | 5/2011 | Bharatan et al. | 381/355 |
| 2011/0127623 A1 | 6/2011 | Fueldner et al. | |
| 2011/0144415 A1 | 6/2011 | Hellmuth et al. | |
| 2011/0156176 A1 | 6/2011 | Huckabee et al. | |
| 2011/0170735 A1 | 7/2011 | Dehe et al. | |
| 2011/0272769 A1 | 11/2011 | Song et al. | |
| 2012/0033831 A1 | 2/2012 | Leitner | |
| 2014/0084396 A1* | 3/2014 | Jenkins et al. | 257/419 |

* cited by examiner

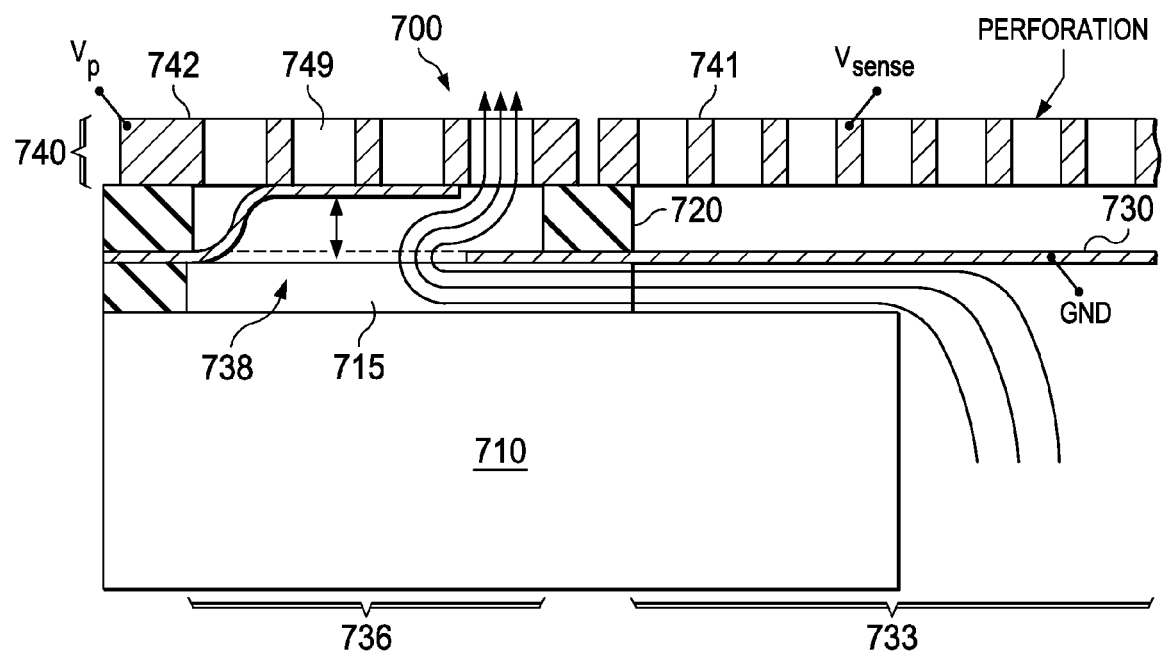
FIG. 7b
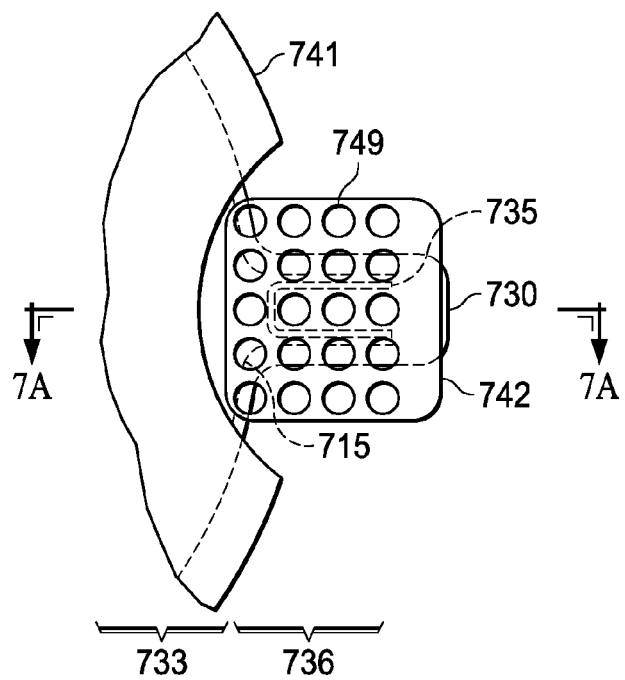

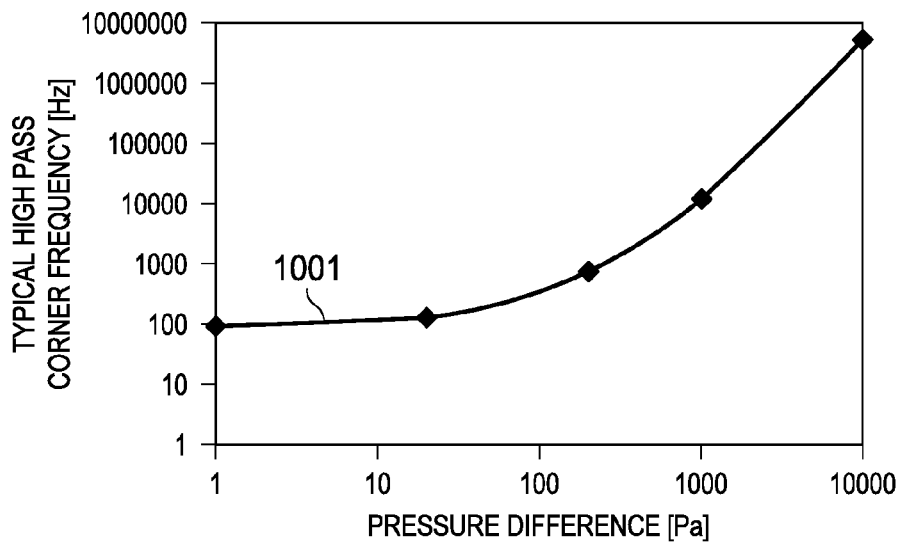
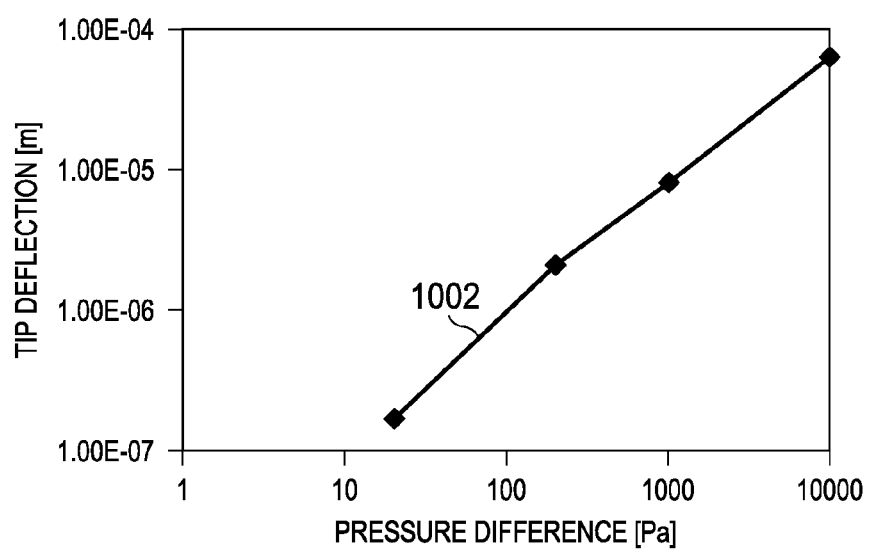
FIG. 10a
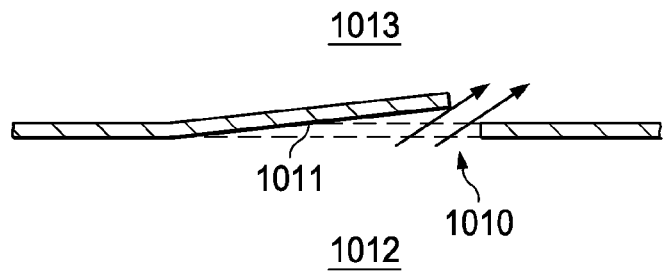
FIG. 10b

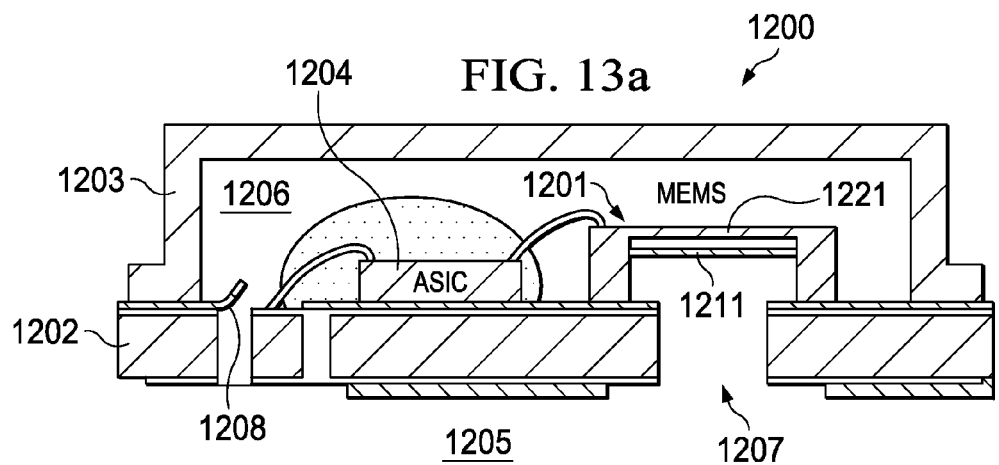
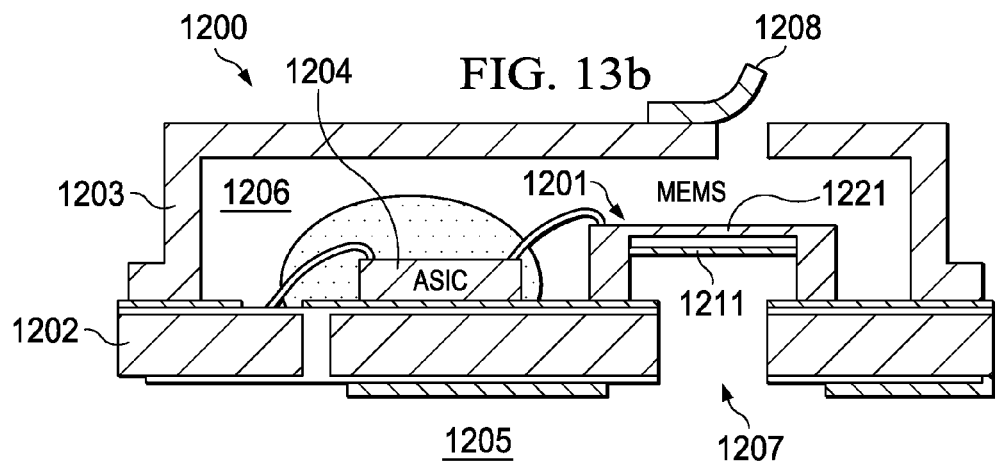
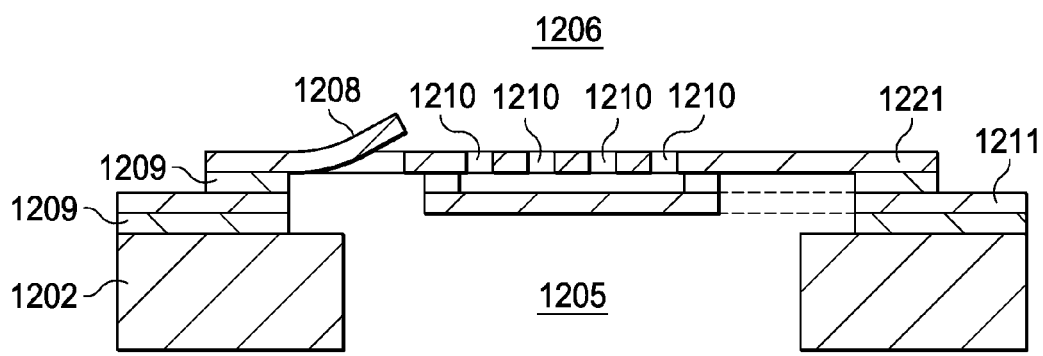

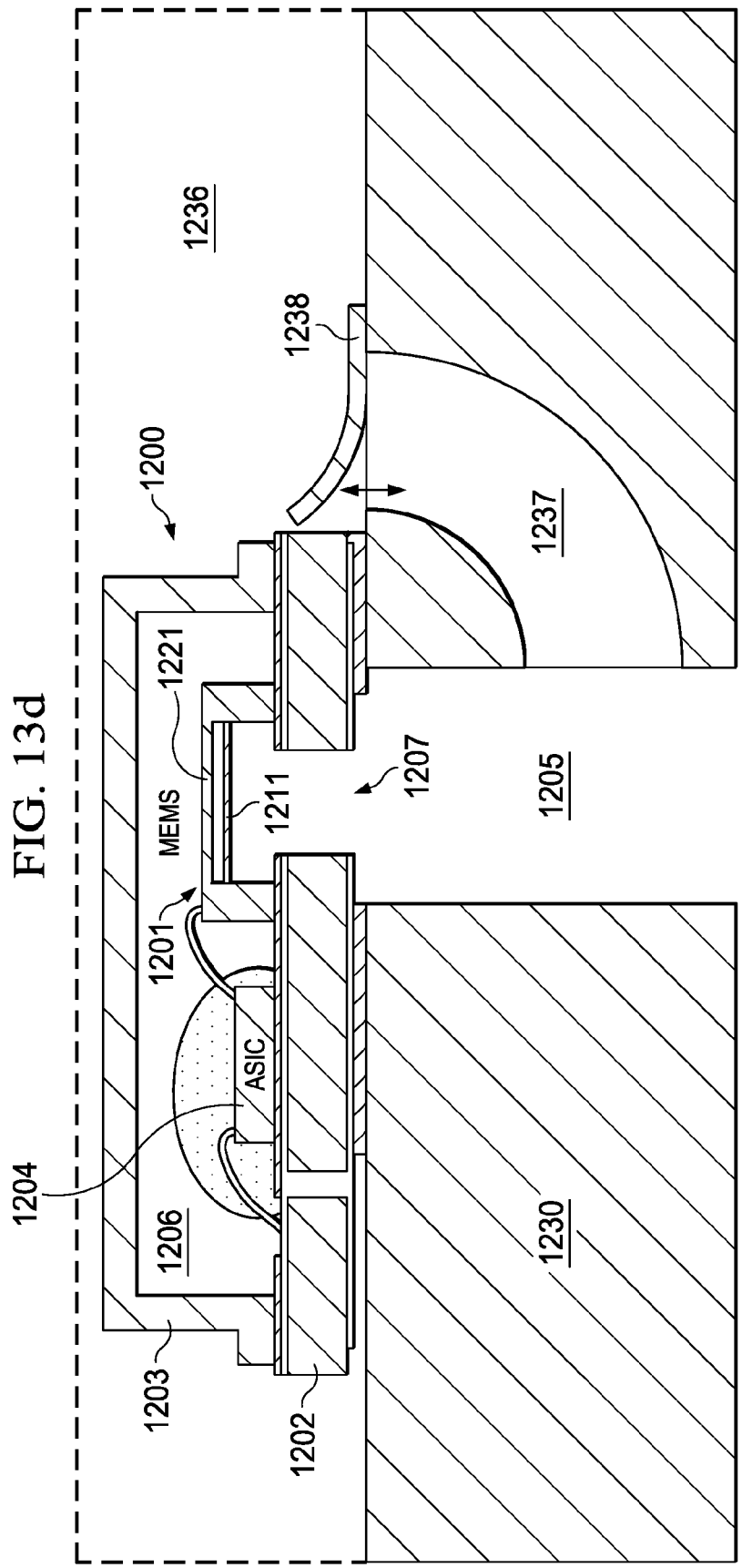

MEMS STRUCTURE WITH ADJUSTABLE VENTILATION OPENINGS

This is a continuation-in-part of application Ser. No. 13/408,971, filed Feb. 29, 2012, which is incorporated by reference in its entirety.

TECHNICAL FIELD

The present invention relates generally to an adjustable ventilation opening in a MEMS structure and a method for operating a MEMS structure.

BACKGROUND

In general, microphones are manufactured in large numbers at low cost. Due to these requirements, microphones are often produced in silicon technology. Microphones are produced with different configurations for their different field of applications. In one example, microphones measure the change in capacitance by measuring the deformation or deflection of the membrane relative to a counter electrode. The microphone is typically operated by setting a bias voltage to an appropriate value.

A microphone may have operation and other parameters such as signal-to-noise ratio (SNR), rigidity of the membrane or counter electrode, or diameter of the membrane which often are set by the manufacturing process. In addition, a microphone may have different characteristics based on different materials used in the manufacturing process.

SUMMARY OF THE INVENTION

In accordance with an embodiment of the present invention, a MEMS structure comprises a backplate, a membrane, and an adjustable ventilation opening configured to reduce a pressure difference between a first space contacting the membrane and a second space contacting an opposite side of the membrane. The adjustable ventilation opening is passively actuated as a function of the pressure difference between the first space and the second space.

In accordance with another embodiment of the present invention, a device comprises a MEMS structure comprising a backplate and a membrane. A housing encloses the MEMS structure. A sound port is acoustically coupled to the membrane. An adjustable ventilation opening in the housing is configured to reduce a pressure difference between a first space contacting the membrane and a second space.

BRIEF DESCRIPTION OF THE DRAWINGS

For a more complete understanding of the present invention, and the advantages thereof, reference is now made to the following descriptions taken in conjunction with the accompanying drawings, in which:

FIG. 5b shows a top-view of an embodiment of the MEMS structure of FIG. 5a;

FIG. 7b shows a cross-section view of an embodiment of an actuated MEMS structure;

FIG. 7c shows a top-view of an embodiment of the MEMS structure of FIG. 7a;

FIG. 10a shows a graph of a shifting of a corner frequency with a tip deflection of a passive adjustable ventilation opening;

FIG. 10b shows a cross-section view of an embodiment of an adjustable ventilation opening comprising a cantilever located on a membrane;

FIG. 13a shows a front view of an embodiment of the invention comprising a device housing, wherein an adjustable ventilation opening is located on a support structure;

FIG. 13b shows a front view of an embodiment of the invention comprising a device housing, wherein an adjustable ventilation opening is located on a lid;

FIG. 13c shows a cross-section view of an embodiment of a MEMS structure, wherein an adjustable ventilation opening is located on a backplate;

FIG. 13d shows an embodiment of the invention comprising a housing, wherein an adjustable ventilation opening is located in the housing.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely sensors or microphones. The invention may also be applied, however, to other MEMS structures such as pressure sensors, RF MEMS, accelerometers, and actuators. Additionally, the specific embodiments will primarily presuppose air as the medium in which pressure waves propagate. The invention, however, is in no way limited to air and will have applications in many media.

Microphones are realized as parallel plate capacitors on a chip. The chip is packaged enclosing a given back-volume. A movable membrane vibrates due to pressure differences such as differences caused by acoustic signals. The membrane displacement is translated into an electrical signal using capacitive sensing.

Figure 1A:
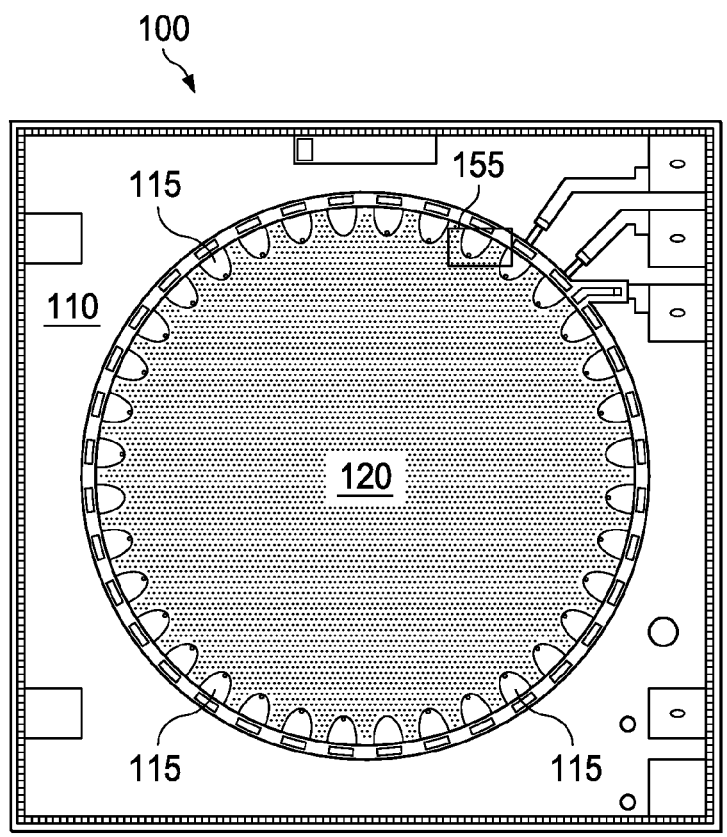
FIG. 1a shows a top view of a MEMS structure.
Figure 1B:
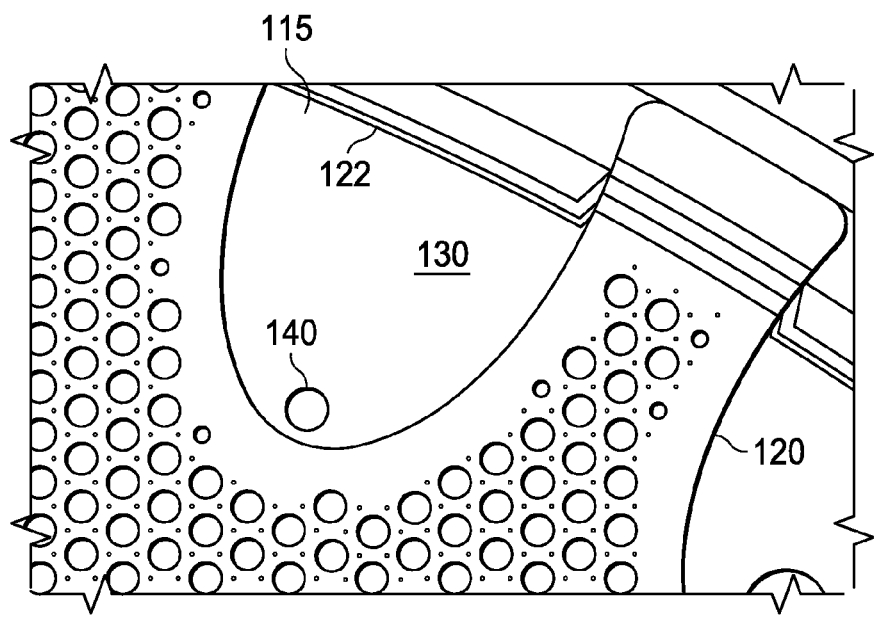
FIG. 1b shows a detailed perspective view of a connection region of a MEMS structure.
Figure 1C:
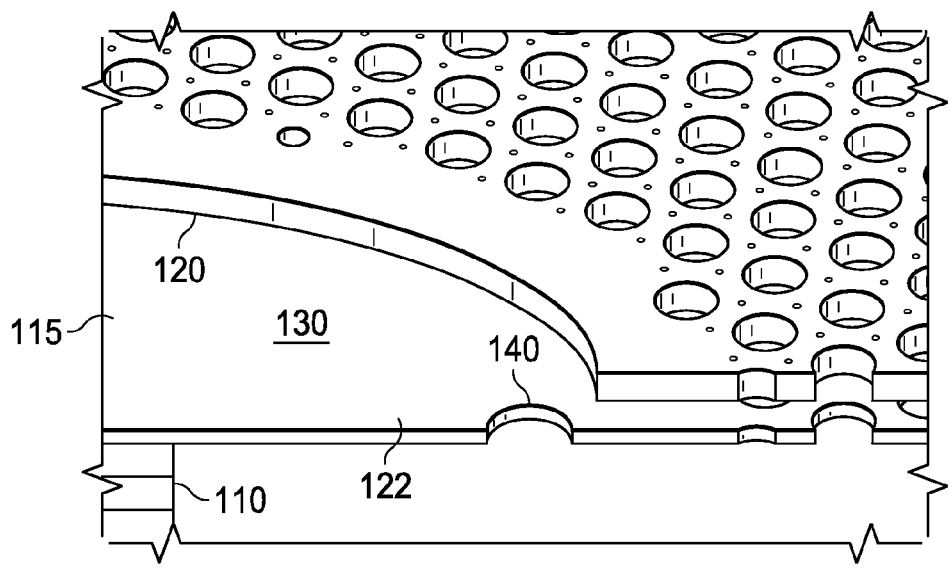
FIG. 1c shows a cross-sectional view of a connection region of a MEMS structure.

FIG. 1a shows a top view of a MEMS device 100. A backplate or counter electrode 120 and a movable electrode or membrane 130 are connected via connection regions 115 to the substrate 110. FIGS. 1b and 1c show detailed perspective views of one connection regions 115 of the MEMS device 100. FIG. 1b shows a top view of the cutout 155 from FIG. 1a and FIG. 1c shows a cross-section view of the same region. A backplate or counter electrode 120 is arranged over a membrane or movable electrode 130. The backplate 120 is perforated to avoid or mitigate damping. The membrane 130 comprises a ventilation hole 140 for low frequency pressure equalization. In view of the adjustable ventilation holes discussed herein, the ventilation hole 140 is optional and may or may not be included with the various embodiments discussed herein.

In the embodiment of FIGS. 1a-1c, the membrane 130 is mechanically connected to the substrate 110 in the connection regions 115. In these regions 115 the membrane 130 cannot move. The backplate 120 is also mechanically connected to the substrate 110 in the connection region 115. The substrate 110 forms a rim 122 to provide space for the back-volume. The membrane 130 and the backplate 120 are connected to the substrate at or close to the rim 122. In this embodiment the rim 122 and the membrane 130 form a circle. Alternatively, the rim 122 and the membrane 130 may comprise a square or may comprise any other suitable geometrical form.

In general, designing and manufacturing a sensor requires a high signal-to-noise ratio (SNR). Among other things, this can be achieved when the change in capacitance to be measured is as great as possible and when the parasitic capacitance is as small as possible. The greater the parasitic portion of the capacitance is relative to the overall capacitance, the smaller the SNR.

The compliance of the back-volume and the resistance of the ventilation path through the ventilation hole define the mechanical RC constant of the sensor. If the ventilation hole is large or if multiple holes are used, the corner frequency is a relatively high frequency and if the ventilation hole is small, the corner frequency is a relatively lower frequency. Both back-volume and the diameter and number of the ventilation holes are given by construction and hence the corner frequency is given by construction. Accordingly, the corner frequency cannot be changed during operation if only a fixed ventilation hole is provided.

A problem with a fixed size ventilation hole is that high energetic signals that have a frequency above the corner frequency of the ventilation hole distort or overdrive the sensor even with the application of electrical filters. Moreover, if a sensor is used for more than one application, two sensors must be integrated into one sensor system, which doubles the system costs.

An embodiment of the invention provides tunable ventilation openings in a MEMS structure. The tunable ventilation openings may be switched between an open position and a closed position. The tunable ventilation holes may also be set in an intermediate position. Another embodiment of the invention provides a variable ventilation opening cross-section. An embodiment of the invention provides a tunable ventilation opening in a sensing region close to a rim of the substrate. A further embodiment provides a tunable ventilation opening in a tuning region outside the sensing region of the membrane. Another embodiment of the invention provides a passively actuated adjustable ventilation opening located in the membrane, the backplate, a substrate, a support structure, a device housing, or a lid. These various embodiments can be implemented individually or in any combination.

Figure 2A:
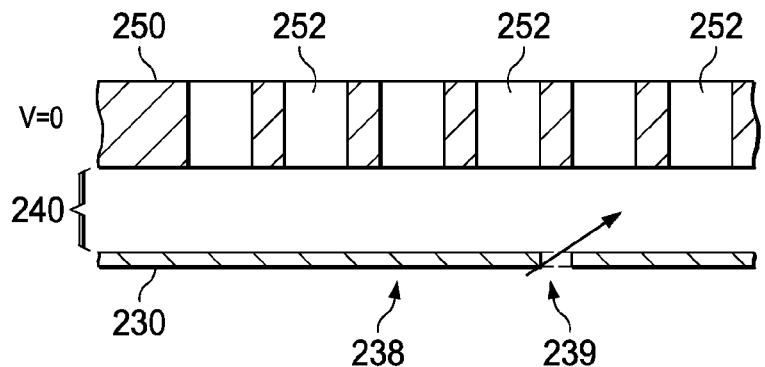
FIGS. 2a-2c show cross-sectional views of an embodiment of an adjustable ventilation opening.
Figure 2B:
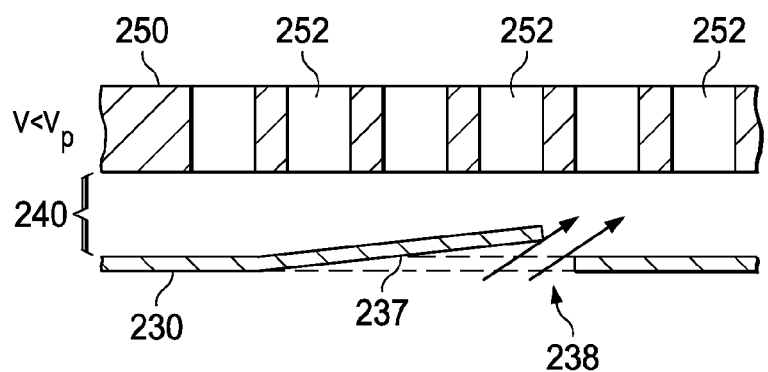
Figure 2C:
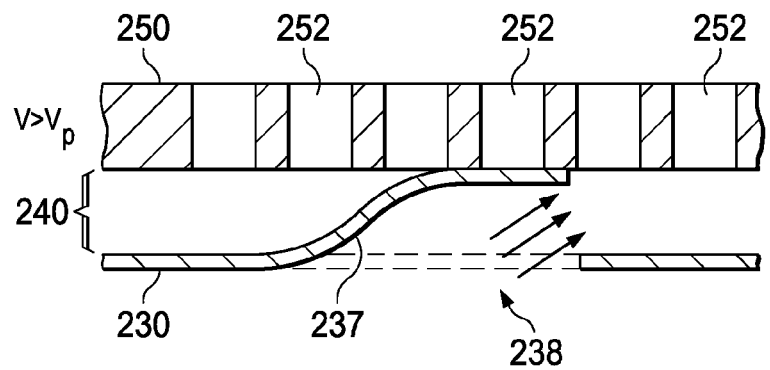
Figure 2D:
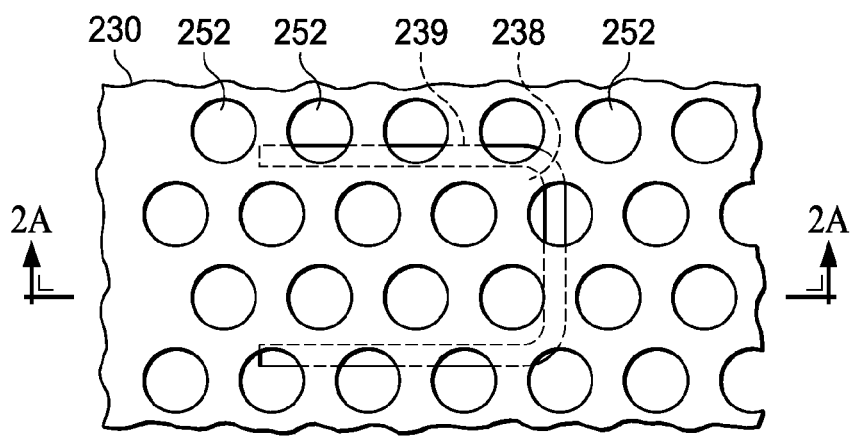
FIG. 2d shows a top view of an embodiment of an adjustable ventilation opening.

FIGS. 2a-2c show a cross sectional view of a backplate or counter-electrode 250 and a membrane or movable electrode 230 having an air gap 240 between them. The backplate 250 is perforated 252 and the membrane 230 comprises an adjustable ventilation opening 238. FIG. 2d shows a top view of this arrangement with the circles indicating the perforated back plate 250, 252 and dark plane being the underlying membrane 230. In this embodiment the movable portion 237 of the adjustable ventilation hole 238 is formed as a U shaped slot 239. The adjustable ventilation opening 238 may comprise of rectangular, square or semicircle form. Alternatively, the adjustable ventilation opening 238 may comprise any geometrical form as long as the form is able to provide a ventilation path. The movable portion 237 of the adjustable ventilation opening 238 may be a cantilever, a bridge or a spring supported structure.

FIG. 2a shows a configuration where the actuation voltage (bias voltage) $V_{bias}=0$. The adjustable ventilation opening 238 is closed forming a small slot 239 in the membrane 230. No actuation voltage provides a minimal ventilation path and therefore a low threshold frequency. The adjustable ventilation opening 238 is in a closed or OFF (non-activated) position. An example of such a low threshold frequency can be seen as frequency "A" in FIG. 2e.

FIG. 2b shows a configuration where the actuation voltage $V_{bias}$ is increased, i.e., is different than 0 V but lower than the pull-in voltage $V_{pull-in}$. The adjustable ventilation opening 238 opens and provides a larger ventilation path than in the configuration of FIG. 2a. The threshold frequency can be seen as frequency "B" in FIG. 2e. It is noted that adjustable ventilation opening 238 may provide a sizable ventilation path when displacement of the movable portion 237 is larger than the thickness of the membrane 230.

FIG. 2c shows a configuration where the actuation voltage $V_{bias}$ is larger than pull-in voltage $V_{pull-in}$. The adjustable ventilation opening 238 is completely open and a large ventilation path is created. The threshold frequency can be seen as frequency "C" in FIG. 2e. By adjusting the actuation voltage the RC constant can be decreased or increased and the threshold frequency can be set according to a desired value. It is noted that the adjustable ventilation opening may already open completely for actuation voltages below the pull-in voltage.

Figure 2E:
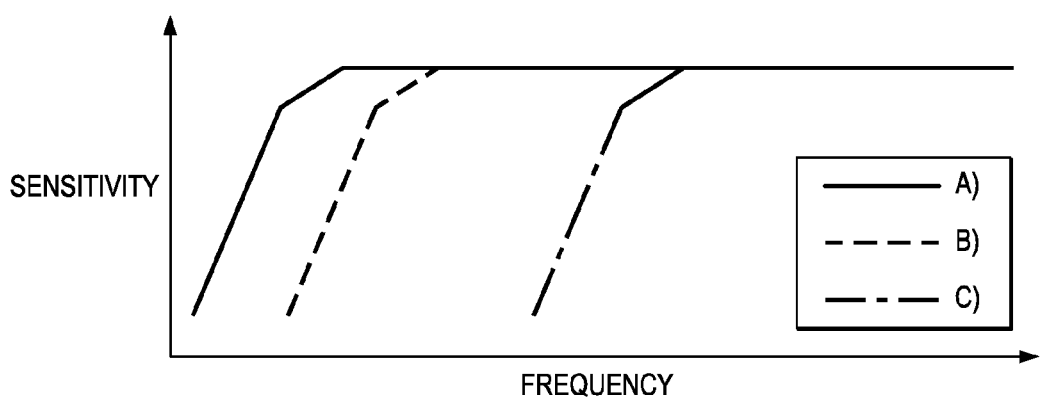
FIG. 2e shows a diagram for a corner or threshold frequency.

Referring now to FIG. 2e, in one embodiment the threshold frequency "A" may be about 10-50 Hz and may be moved to about 200-500 Hz as threshold frequency "C." Alternatively, the threshold frequency in "A" is about 10-20 Hz and is moved to about 200-300 Hz in "C." In another embodiment the threshold frequency "A" would be 10-100 Hz and is changed to 500-2000 Hz in "C."

The threshold frequency in position "A" may also depend on the number of adjustable ventilation openings and the gap distance a slot forms in the membrane. The threshold frequency in position "A" is higher for a MEMS structure with more adjustable ventilation openings (e.g., 32 adjustable ventilation openings) than for a MEMS structure with less adjustable ventilation openings (e.g., 2, 4 or 8 adjustable ventilation openings). The threshold frequency is also higher for MEMS structures with a larger slot gap (larger slot width and/or larger slot length) defining the adjustable ventilation opening than for those with a smaller slot gap.

Figure 3A:
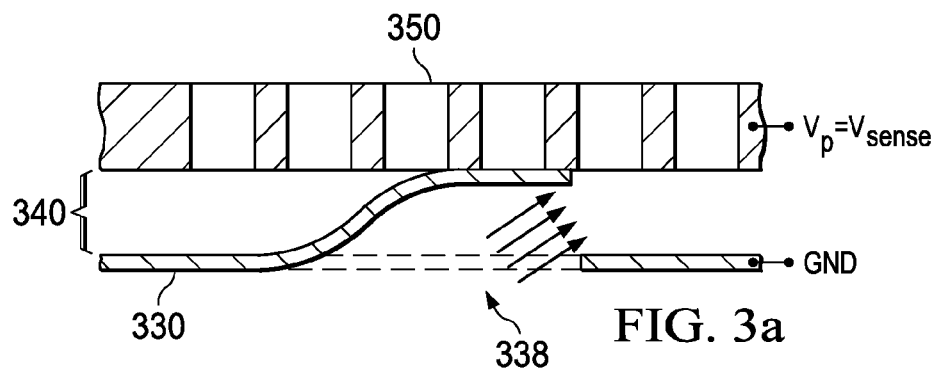
FIGS. 3a-3d show embodiments and configuration of an adjustable ventilation opening.

The embodiment of FIG. 3a shows a configuration of an actuation voltage (tuning or switching voltage) wherein the actuation voltage is identical to the sensing bias. The MEMS structure comprises a single electrode on the backplate 350, an air gap 340 and a membrane 330. The electrode of the backplate 350 is set to an actuation potential and the membrane 330 is set to ground. The adjustable ventilation opening 338 is closed with a low actuation voltage (OFF position) and open with a high actuation voltage (ON position). A low actuation voltage results in a low corner or threshold frequency and a low sensitivity of the MEMS structure, and a high actuation voltage results in a high corner or threshold frequency and a high sensitivity.

Figure 3B:
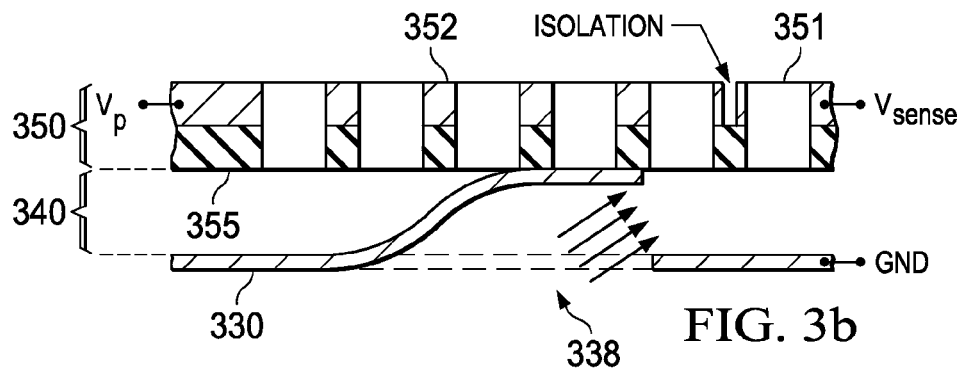

The embodiment of FIG. 3b shows a configuration wherein the actuation voltage (tuning or switching voltage) is independent from the sensing bias. The MEMS structure comprises a structured backplate 350, e.g., a backplate that has at least two electrodes, an air gap 340 and a membrane 330. The second electrode 352 of the backplate 350 is set to an actuation potential and the first electrode 351 is set to a sense potential. The membrane 330 is set to ground. The two electrodes are isolated from each other. For example, the backplate 350 may comprise the structured electrode and an isolation support 355. The isolation support 355 may face toward the membrane 330 or may face away from the membrane 330. The tuning or switching voltage does not influence the sensitivity of the MEMS structure.

The adjustable ventilation opening is 338 closed with a low actuation voltage (OFF position) and open with a high actuation voltage (ON position). A low actuation voltage results in a low corner or threshold frequency and a high actuation voltage results in a high corner or threshold frequency. The sense bias is independent from the actuation voltage and can be kept constant or independently decreased or increased.

Figure 3C:
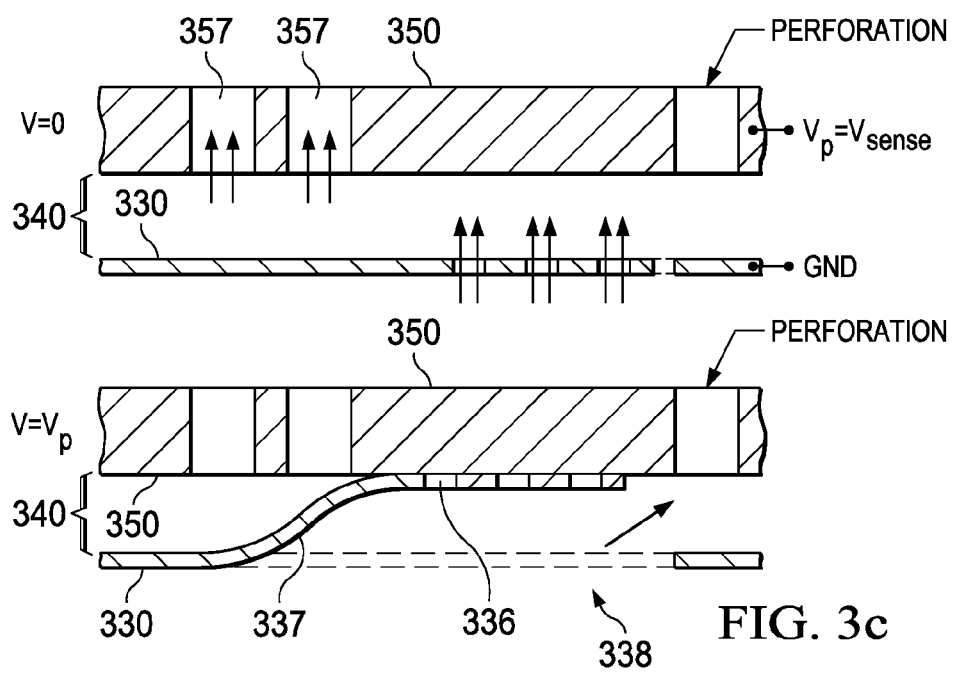

The embodiment of FIG. 3c shows a configuration of an actuation voltage (tuning or switching voltage) wherein the actuation voltage is identical to the sensing bias. The MEMS structure comprises a single electrode in the backplate 350, an air gap 340 and a membrane 330. The adjustable ventilation opening 338 is closed with a high actuation voltage (ON position) and is open with a low actuation voltage (OFF position). The movable portion 337 of the adjustable ventilation opening 338 touches the backplate 350 when activated and is in plane with the rest of the membrane when not activated. A low actuation voltage results in a high corner or threshold frequency and a low sensitivity of the MEMS structure, and a high actuation voltage results in low corner or threshold frequency and a high sensitivity of the MEMS structure. The backplate 350 comprises ventilation openings 357 and the movable portion 337 of the adjustable ventilation opening 338 comprises ventilation openings 336. The ventilation openings 336 in the movable portion 337 of the adjustable ventilation opening 338 are closed in an ON (or activated) position. There is a minor ventilation path through the adjustable ventilation opening 338 when the adjustable ventilation opening is in the ON (or activated) position.

Figure 3D:
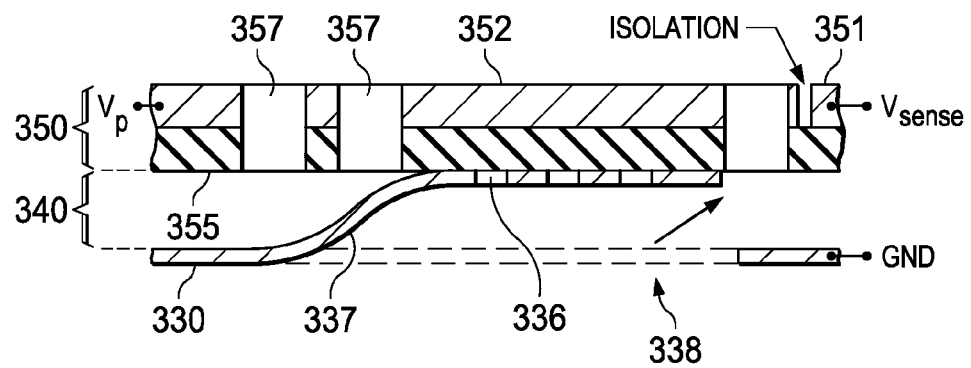

The embodiment of FIG. 3d shows the actuation voltage (tuning or switching voltage) wherein the actuation voltage is independent from the sensing bias. This MEMS structure comprises a structured backplate 350, e.g., the backplate may comprise a first electrode 351 and a second electrode 352, an air gap 340 and a membrane 330. Alternatively, the structured backplate 350 may comprise more than two electrodes. The second electrode 352 of the backplate 350 is set to an actuation potential and the first electrode 351 is set to a sense potential. The membrane 330 is set to ground. The first electrode 351 and the second electrode 352 are isolated from each other. For example, the backplate 350 may comprise the structured electrode and an isolation support 355. The isolation support 355 may face toward the membrane 330 or may face away from the membrane 330. The tuning or switching voltage does not influence the sensitivity of the MEMS structure.

The adjustable ventilation opening is closed with a high actuation voltage (ON position) and is open with a low actuation voltage (OFF position). A low actuation voltage (OFF position) results in a high corner or threshold frequency and a high actuation voltage (ON position) results in a low corner or threshold frequency. The sense bias is independent from the actuation voltage and can be kept constant or independently decreased or increased.

The backplate 350 comprises ventilation openings 357 and the movable portion 337 of the adjustable ventilation opening 338 comprises also ventilation openings 336. The ventilation openings 336 in the adjustable ventilation opening 338 are closed in the ON position. There is a minor ventilation path through the ventilation openings 357 of the backplate 338 and the ventilation openings 336 of the adjustable ventilation opening 338 when the adjustable ventilation opening 338 is open. There is a ventilation path through the ventilation openings 357 of the backplate 350 and the ventilation openings 336 of the adjustable ventilation opening 338 when the adjustable ventilation opening 338 is closed or in an OFF position.

Figure 4A:
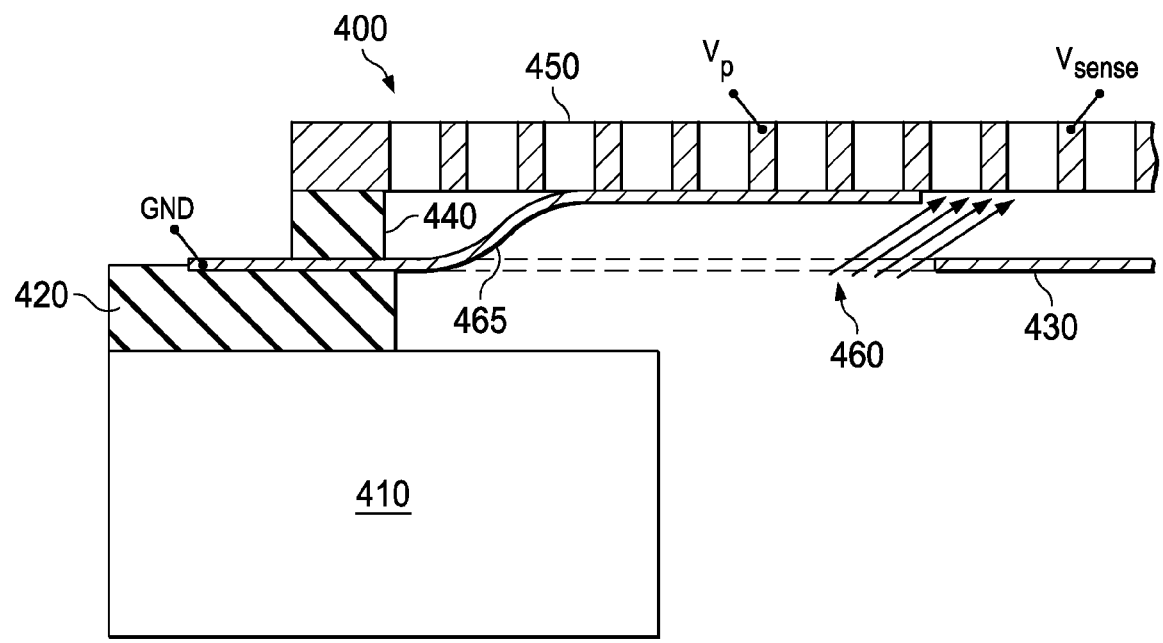
FIG. 4a shows a cross-sectional view of an embodiment of a MEMS structure, wherein the membrane is pulled toward the backplate.

The embodiment of FIG. 4a shows a cross-sectional view of a MEMS structure 400. The MEMS structure comprises a substrate 410. The substrate 410 comprises silicon or other semiconductor materials. Alternatively, the substrate 410 comprises compound semiconductors such as GaAs, InP, Si/Ge, or SiC, as examples. The substrate 410 may comprise single crystal silicon, amorphous silicon or polycrystalline silicon (polysilicon). The substrate 410 may include active components such as transistors, diodes, capacitors, amplifiers, filters or other electrical devices, or an integrated circuit. The MEMS structure 400 may be a stand-alone device or may be integrated with and IC into a single chip.

The MEMS structure 400 further comprises a first insulating layer or spacer 420 disposed over the substrate 410. The insulating layer 420 may comprise an insulating material such a silicon dioxide, silicon nitride, or combinations thereof.

The MEMS structure 400 further comprises a membrane 430. The membrane 430 may be a circular membrane or a square membrane. Alternatively, the membrane 430 may comprise other geometrical forms. The membrane 430 may comprise conductive material such as polysilicon, doped polysilicon or a metal. The membrane 430 is disposed above the insulating layer 420. The membrane 430 is physically connected to the substrate 410 in a region close to the rim of the substrate 410.

Moreover, the MEMS structure 400 comprises a second insulating layer or spacer 440 disposed over a portion of the membrane 430. The second insulating layer 440 may comprise an insulting material such as a silicon dioxide, silicon nitride, or combinations thereof.

A backplate 450 is arranged over the second insulating layer or spacer 440. The backplate 450 may comprise a conductive material such as polysilicon, doped polysilicon or a metal, e.g., aluminum. Moreover, the backplate 450 may comprise an insulating support or insulating layer regions. The insulating support may be arranged toward or away from the membrane 430. The insulating layer material may be silicon oxide, silicon nitride or combinations thereof. The backplate 450 may be perforated.

The membrane 430 may comprise at least one adjustable ventilation opening 460 as described above. The adjustable ventilation openings 460 may comprise a movable portion 465. In one embodiment the adjustable ventilation openings 460 are located in a region close to the rim of the substrate 410. For example, the adjustable ventilation openings 460 may be located in the outer 20% of the radius of the membrane 430 or the outer 20% of the distance from a center point to the membrane 430 edge of a square or a rectangle. In particular, the adjustable ventilation openings 460 may not be located in a center region of the membrane 430. For example, the adjustable ventilation openings 460 may not be located in the inner 80% of the radius or the distance. The adjustable ventilation openings 460 may be located in equidistant distances from each other along a periphery of the membrane 430.

The embodiment of FIG. 4a is configured so that the adjustable ventilation openings 460 open toward the backplate 450. The membrane 430 and the backplate 450 may have any of the configurations as described in FIGS. 2a-2d and 3a-3d. The backplate 450 is set to a sense voltage $V_{sense}$ and an actuation voltage $V_p$ (sense voltage and actuation voltage can be the same or different as described above) and the membrane 430 is set to ground, or vice versa.

Figure 4B:
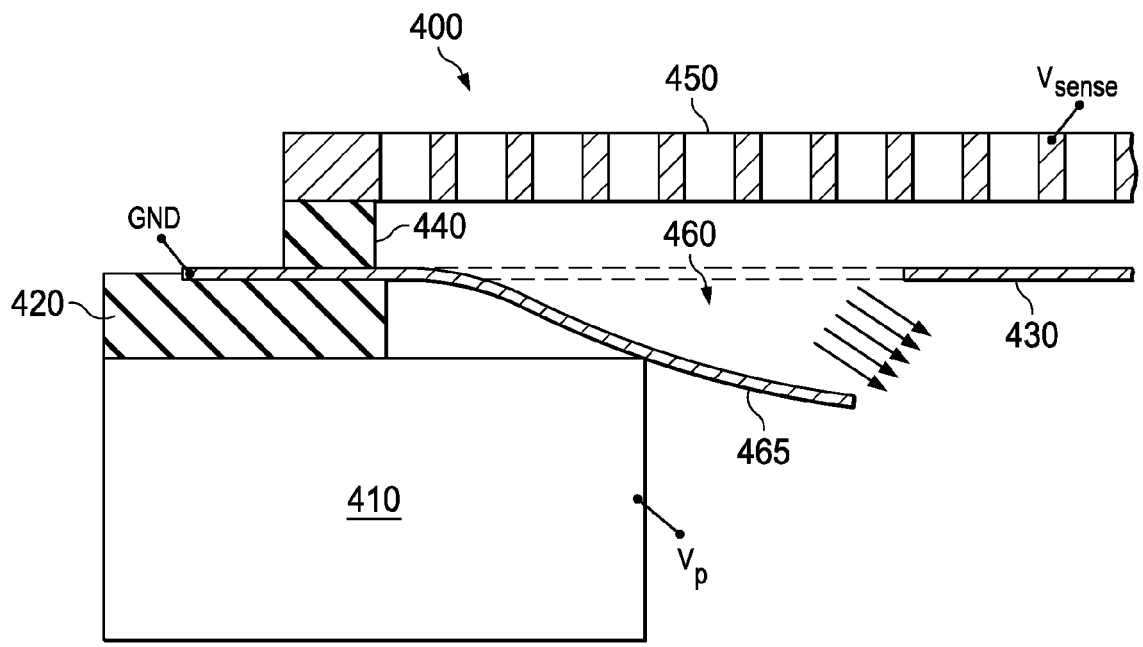
FIG. 4b shows a cross-sectional view of an embodiment of a MEMS structure, wherein the membrane is pulled toward the substrate.

The MEMS structure 400 of the embodiment of FIG. 4b shows a similar structure to that of the embodiment in FIG. 4a. However, the configuration is different, e.g., the movable portion 465 of the adjustable ventilation opening 460 is pulled toward the substrate 410. The backplate is set to a sense voltage $V_{sense}$, the substrate is set to the actuation voltage $V_p$ and the membrane is set to ground. In this configuration of the MEMS structure 400 the actuation voltage (tuning or switching voltage) is independent of the sensing voltage.

Figure 5A:
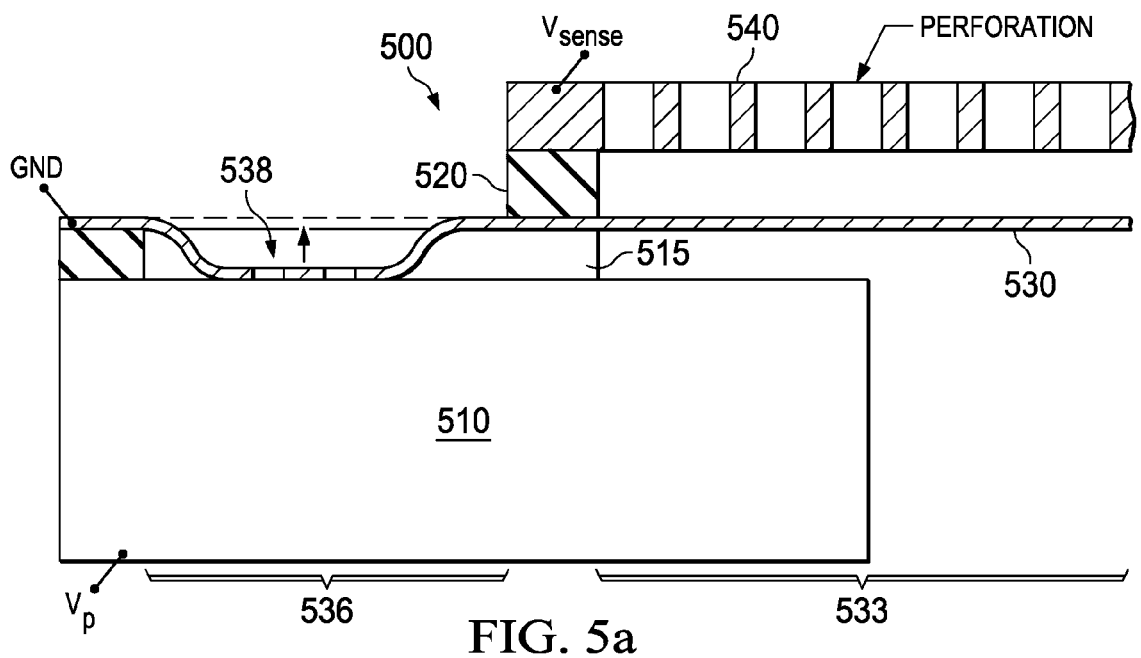
FIG. 5a shows a cross-section view of an embodiment of a MEMS structure.
Figure 5B:
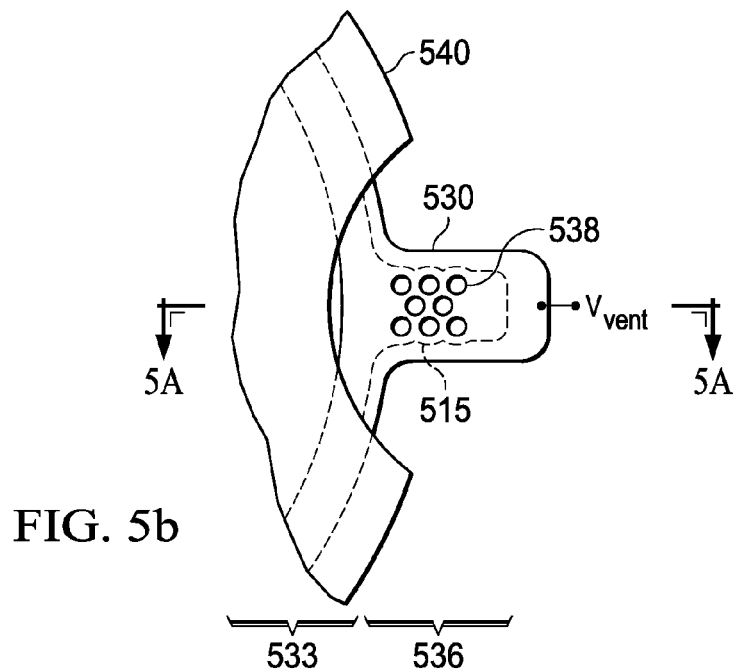

The embodiment of FIG. 5a shows a cross sectional view and FIG. 5b shows a top view of a MEMS structure 500 having a membrane 530 extending over a portion of a substrate 510 and outside a sensing region 533. The MEMS structure 500 comprises a substrate 510, a connection region 520, a membrane 530 and a backplate 540 which comprise similar materials as described with respect to the embodiment in FIG. 4a. The membrane 530 comprises a sensing region 533 and a tuning region 536. The sensing region 533 is located between the opposite rims of the substrate 510 or between the opposite connection regions 520. The tuning region 536 extends over a portion of the substrate 510 and is located outside the sensing region 533. The sensing region 533 may be located on a first side of the connection region 520 and the tuning region 536 may be located on a second side of the connection region 520. A recess 515 (under etch) is formed between the membrane 530 and the substrate 510 in the tuning region 536. The backplate 540 overlies only the sensing region 533 but not the tuning region 536 of the membrane 530. The backplate 540 may be perforated. The backplate 540 is set to a bias voltage $V_{sense}$, the substrate 510 is set to a tuning voltage $V_p$ and the membrane is set to ground. In this configuration of the MEMS structure 500 the tuning voltage is independent of the sensing voltage.

The tuning region 536 of the membrane 530 comprises at least one adjustable ventilation openings 538 which provide a ventilation path in a non-actuated position (OFF position) and which does not provide a ventilation path in an actuated position (ON position). The non-actuated or open position (OFF position) is a position wherein the adjustable ventilation openings 538 are in the same plane as the membrane 530 in the sensing region 533 in its resting position. The actuated or closed position (ON position) is a position wherein the adjustable ventilation openings 538 are pressed against the substrate 510 and the ventilation path is blocked. Intermediate positions may be set by pulling the adjustable ventilation openings 538 towards the substrate 510 but where the adjustable ventilation openings 538 are not pressed against the substrate 510. It is noted that the sensing region 533 may or may not comprise adjustable ventilation openings 538.

Figure 6A:
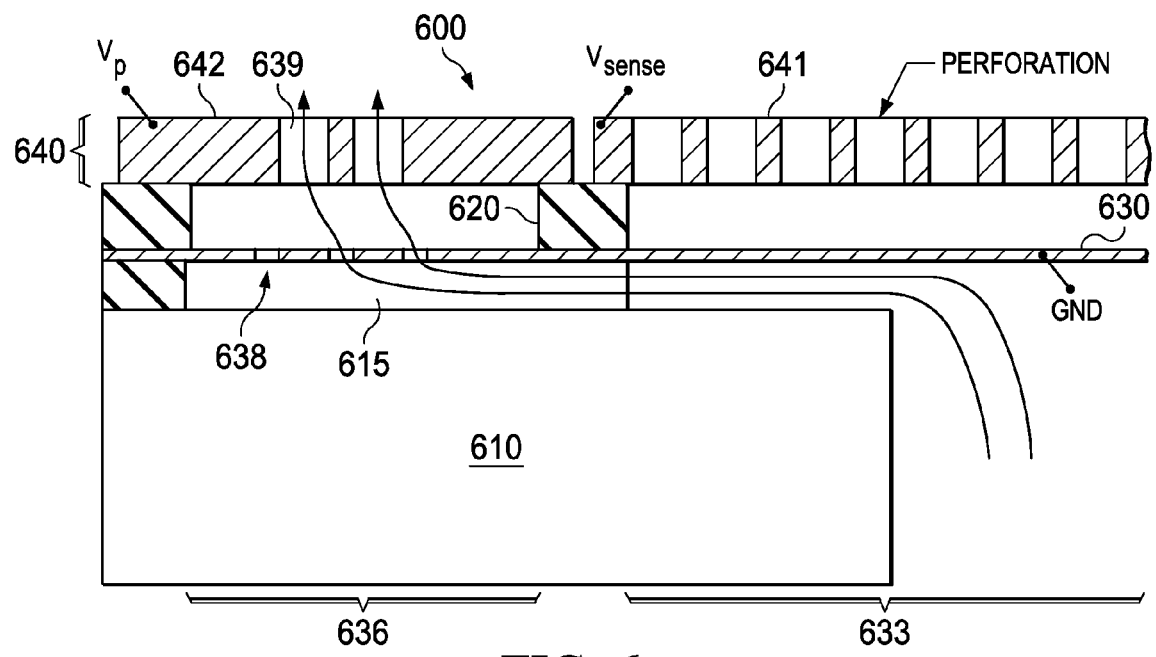
FIG. 6a shows a cross-section view of an embodiment of a non-actuated MEMS structure.
Figure 6B:
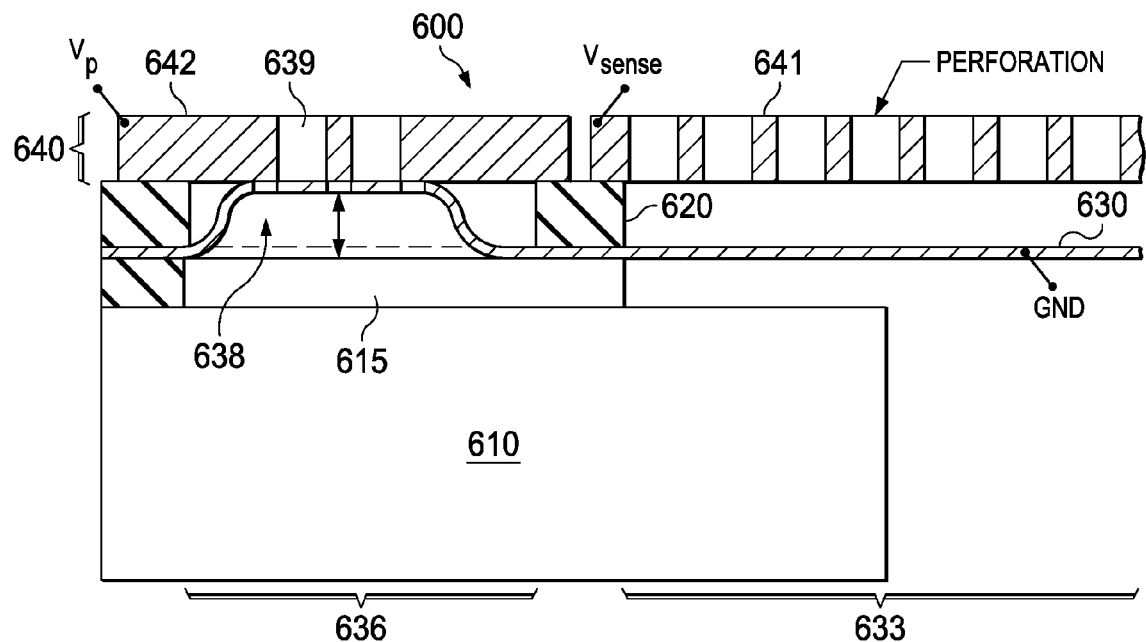
FIG. 6b shows a cross-section view of an embodiment of an actuated MEMS structure.

The embodiment of FIGS. 6a and 6b show a cross sectional view of a MEMS structure 600 having a membrane 630 extending over a portion of a substrate 610 outside a sensing region 633. The MEMS structure 600 comprises a substrate 610, a connection region 620, a membrane 630 and a backplate 640 which comprise similar materials as described with respect to the embodiment in FIG. 4a. The membrane 630 comprises a sensing region 633 and a tuning region 636. The sensing region 633 is located between the opposite rims of the substrate 610 or between the opposite connection regions 620. The tuning region 636 extends over a portion of the substrate 610 and is located outside the sensing region 633. The sensing region 633 may be located on a first side of the connection region 620 and the tuning region 636 may be located on a second side of the connection region 620. A recess 615 is formed between the membrane 630 and the substrate 610 in the tuning region 636.

The backplate 640 overlies the sensing region 633 and the tuning region 636 of the membrane 630. The backplate 640 may be perforated in the sensing region 633 and the tuning region. Alternatively, the backplate 640 may be perforated in the sensing region 633 but not in the tuning region 636. The backplate 640 comprises a first electrode 641 and a second electrode 642. Alternatively, the backplate 640 comprise more than two electrodes. The first electrode 641 is isolated from the second electrode 642. The first electrode 641 is disposed in the sensing region 633 and the second electrode 642 is disposed in the tuning region 636. The first electrode 641 is set to a bias voltage $V_{sense}$, and the second electrode 642 is set to the tuning voltage $V_p$. The membrane 630 is set to ground. In this configuration of the MEMS structure 600 the tuning voltage is independent of the sensing voltage.

The tuning region 636 of the membrane 630 comprises one or more adjustable ventilation openings 638 which provide a ventilation path in an non-actuated position (OFF position) in FIG. 6a and which does not provide a ventilation path in an actuated position (ON position) in FIG. 6b. The open position or non-actuated (OFF position) is a position wherein the adjustable ventilation openings 638 are in the same plane as the membrane 630 in the sensing region 633 in its resting position. The closed position or actuated position (ON position) is a position wherein the adjustable ventilation openings 638 are pressed against the backplate 640 and the ventilation path is blocked. The MEMS structure 600 provides a ventilation path and a high corner frequency when it is not in an actuated position (OFF position). The MEMS structure 600 provides a closed ventilation path and a low corner frequency when it is in an actuated position (ON position). Intermediate positions may be set by pulling the adjustable ventilation openings 638 toward the backplate 640 but where the adjustable ventilation openings 638 are not pressed against the backplate 640. It is noted that the sensing region 633 may or may not comprise adjustable ventilation openings 638.

The backplate 640 comprises ventilation openings 639 and the membrane 630 comprises adjustable ventilation openings 638 in the tuning region 636. In one embodiment the ventilation openings 639 and the adjustable ventilation openings 638 are reversely aligned with respect to each other.

Figure 7A:
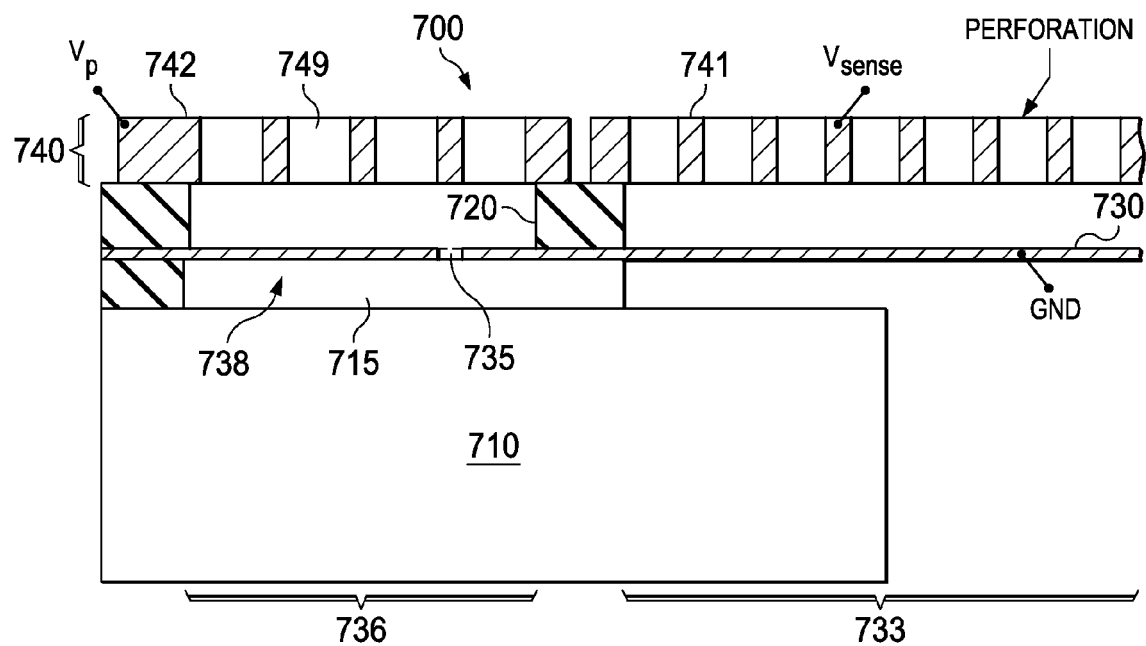
FIG. 7a shows a cross-section view of an embodiment of a non-actuated MEMS structure.

The embodiment of FIGS. 7a and 7b show a cross sectional view and FIG. 7c shows a top view of a MEMS structure 700 having a membrane 730 extending over a portion of a substrate 710 and outside a sensing region 733. The MEMS structure 700 comprises a substrate 710, a connection region 720, a membrane 730 and a backplate 740 which comprise similar materials as described with respect to the embodiment of FIG. 4a. The backplate 740 may comprise a sensing backplate (e.g. circular or rectangle) 741 and a backplate bridge 742.

The membrane 730 comprises a sensing region 733 and a tuning region 736. The sensing region 733 is located between the opposite rims of the substrate 710 or between the opposite connection regions 720. The tuning region 736 extends over a portion of the substrate 710 and is located outside the sensing region 733. The sensing region 733 may be located on a first side of the connection region 720 and the tuning region 736 may be located on a second side of the connection region 720. A recess 715 (under etch) is formed between the membrane 730 and the substrate 710 in the tuning region 736. The membrane 730 comprises an adjustable ventilation opening 738 formed by a slot 735. The slot 735 forms a movable portion as described in FIGS. 2a-2c for the adjustable ventilation opening 738.

The backplate 740 overlies the sensing region 733 and the tuning region 736 of the membrane 730. For example, the sensing backplate 741 (first electrode) overlies the sensing region 733 and the backplate bridge 742 (second electrode) overlies the tuning region 736. Alternatively, the backplate 740 comprise more than two electrodes. The first electrode 741 is isolated from the second electrode 742. The first electrode 741 is set to a bias voltage $V_{sense}$ and second electrode 742 is set to a tuning voltage $V_p$. The membrane 730 is set to ground. In this configuration of the MEMS structure 700 the tuning voltage is independent of the sensing voltage. The backplate 740 may be perforated in the sensing region 733 and the tuning region 736. Alternatively, the backplate 740 may be perforated in the sensing region 733 but not in the tuning region 736. The backplate bridge 742 comprises ventilation openings 749.

The tuning region 736 of the membrane 730 comprises one or more adjustable ventilation openings 738 which provide a ventilation path in an actuated position (ON position) in FIG. 7b and which provide a smaller ventilation path in a non-actuated position (OFF position) in FIG. 7a. The closed or non-actuated position (OFF position) is a position wherein the adjustable ventilation openings 738 are in the same plane as the membrane 730 in the sensing region 733 in its resting position. The open or actuated position (ON position) is a position wherein the adjustable ventilation openings 738 are pressed against the backplate 740 and the ventilation path is open. The MEMS structure 700 provides a ventilation path and a high corner frequency when it is in an actuated position (ON position). The MEMS structured 700 provides a closed ventilation path and a low corner frequency when it is in non-actuated position (OFF position). Intermediate positions may be set by pulling the adjustable ventilation openings 738 toward the backplate 740 but where the adjustable ventilation openings 738 are not pressed against the backplate 740. It is noted that the sensing region 733 may or may not comprise adjustable ventilation openings 738.

Figure 8A:
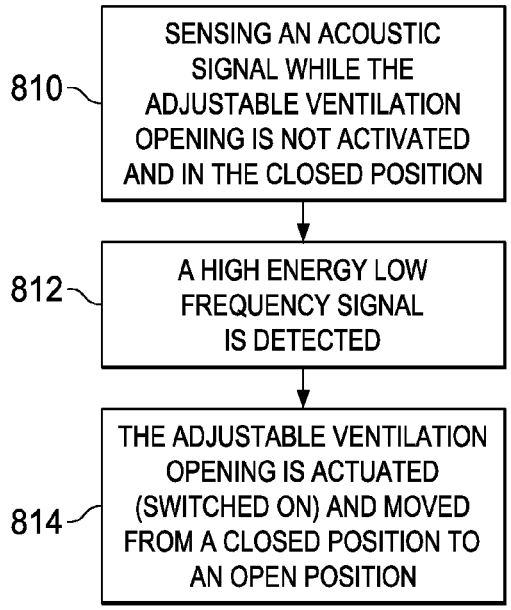
FIG. 8a shows a flow chart of an operation of a MEMS structure, wherein the adjustable ventilation opening is originally closed.

FIG. 8a shows an embodiment of operating a MEMS structure. In a first step 810, an acoustic signal is sensed by moving a membrane relative to a backplate. The adjustable ventilation opening is in a closed position. In a next step 812, a high energy signal is detected. The adjustable ventilation opening is moved from a closed position to an open position, 814. The open position may be a completely open position or a partially open position.

Figure 8B:
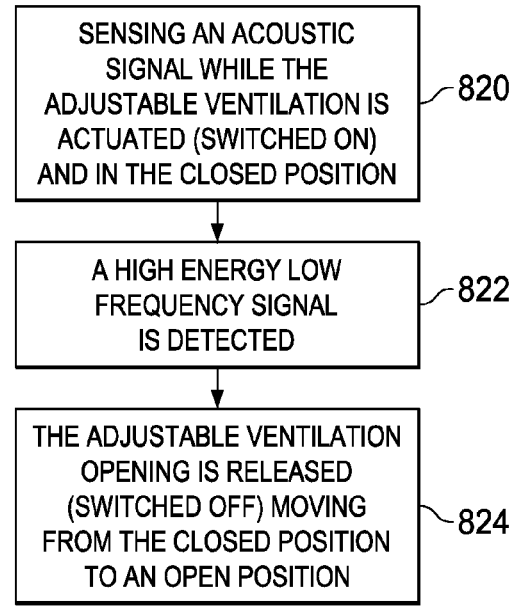
FIG. 8b shows a flow chart of an operation of a MEMS structure, wherein the adjustable ventilation opening is originally open.

FIG. 8b shows an embodiment of operating a MEMS structure. In a first step, 820, an acoustic signal is sensed by moving a membrane relative to a backplate. The adjustable ventilation opening is in an actuated (ON) closed position. In a next step 822, a high energy signal is detected. The adjustable ventilation opening is moved from the actuated (ON) closed position to a non-actuated (OFF) open position, 824. The open position may be a completely open position or a partially open position.

Figure 8C:
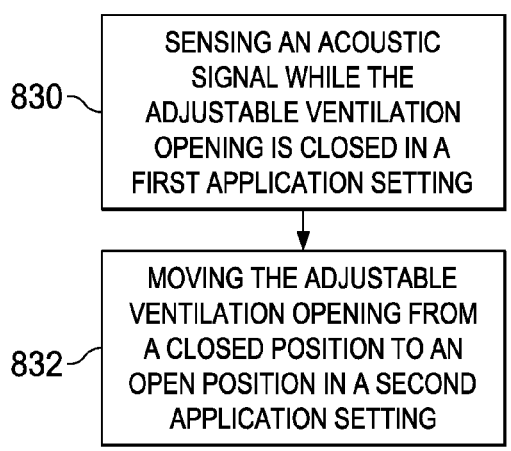
FIG. 8c shows a flow chart of an operation of a MEMS structure, wherein the adjustable ventilation opening is opened to switch from a first application setting to a second application setting.

FIG. 8c shows an embodiment of operating a MEMS structure. In a first step, 830, the MEMS structure is in a first application setting sensing acoustic signals by moving a membrane relative to a backplate. The adjustable ventilation opening is in a closed position. In a second step, 832, the MEMS structure is in a second application setting sensing acoustic signals by moving a membrane relative to the backplate. The adjustable ventilation opening is moved from a closed position to an open position. The open position may be a completely open position or a partially open position.

Figure 8D:
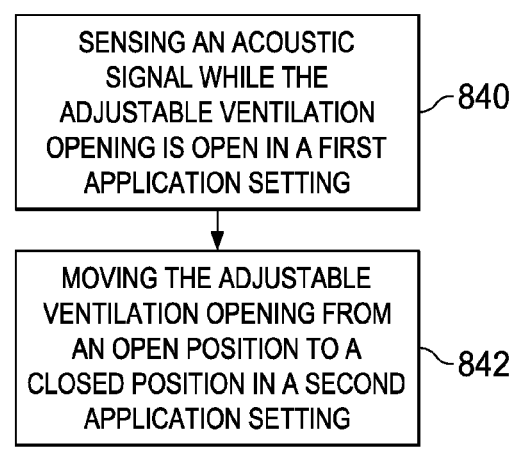
FIG. 8d shows a flow chart of an operation of a MEMS structure, wherein the adjustable ventilation opening is closed to switch from a first application setting to a second application setting.

FIG. 8d shows an embodiment of operating a MEMS structure. In a first step, 840, the MEMS structure is in a first application setting sensing acoustic signals by moving a membrane relative to a backplate. The adjustable ventilation opening is in an open position. In a second step, 842, the MEMS structure is in a second application setting sensing acoustic signals by moving a membrane relative to the backplate. The adjustable ventilation opening is moved from an open position to a closed position. The closed position may be a completely closed position or a partially closed position.

A further embodiment involves a passively actuated adjustable ventilation opening. The adjustable ventilation opening is passive because it does not receive any control input. The adjustable ventilation opening can be mechanically actuated by the pressure difference acting on it.

Figure 9A:
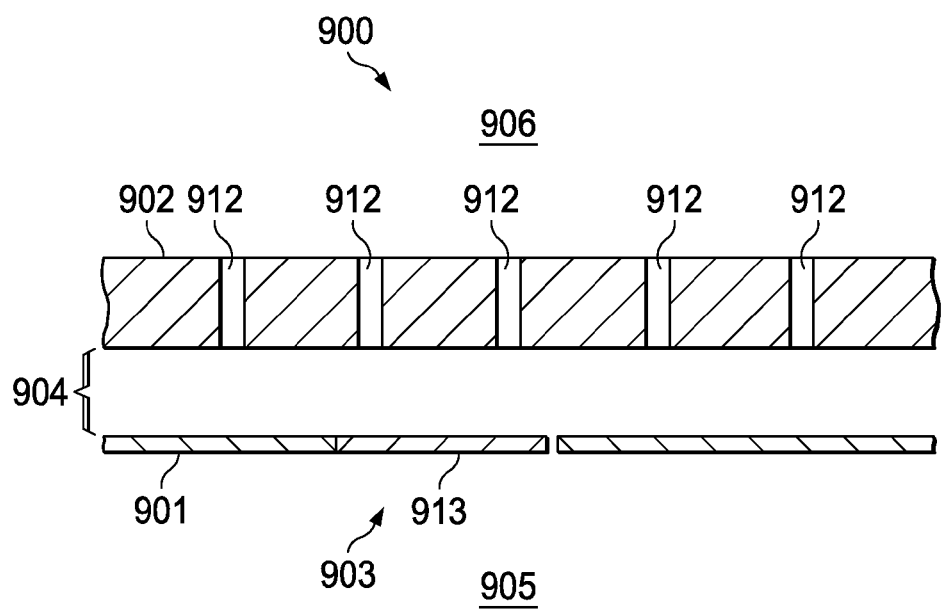
FIG. 9a shows a cross-section view of an embodiment of a MEMS structure with a passive adjustable ventilation opening.
Figure 9B:
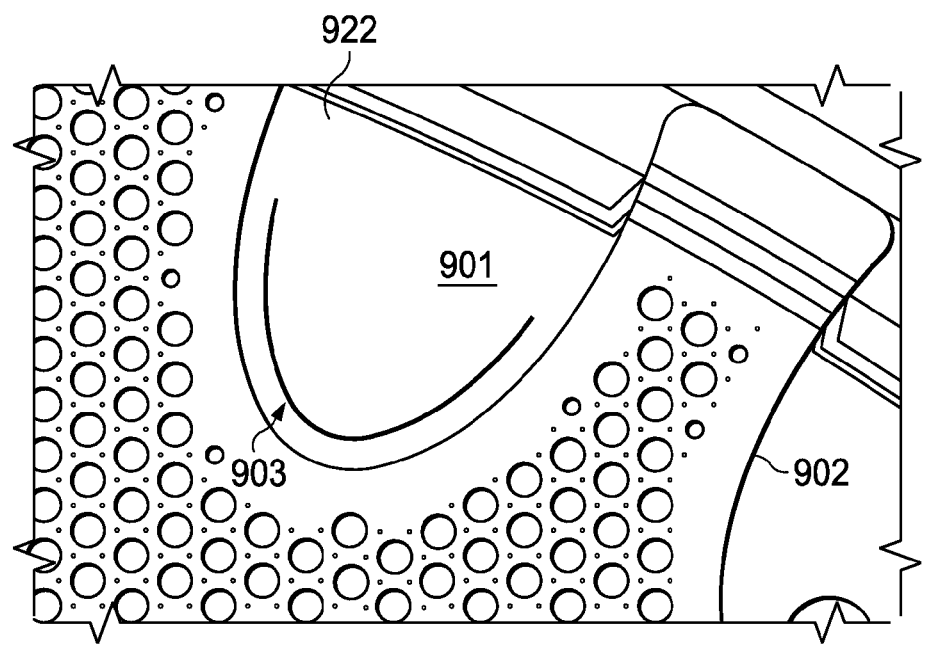
FIG. 9b shows a top view of an embodiment of a MEMS structure with a passive adjustable ventilation opening.

FIGS. 9a and 9b show an embodiment of a MEMS structure 900 with a passively actuated adjustable ventilation opening on the membrane. FIG. 9a shows a cross section of the MEMS structure 900, which includes a membrane 901, a backplate 902, and a ventilation opening 903. The backplate 902 is perforated with backplate perforation holes 912. The backplate 902 and the membrane 901 are separated by a gap distance 904. The gap distance can range from 0.5 µm and 5 µm. In one embodiment, the gap distance is about 2 µm.

In this embodiment, the ventilation opening 903 is located in the membrane 901. As will be discussed below, other locations are also possible. The opening 903 is formed from a flexible structure 913 configured to deflect when acted upon by a force or pressure difference. As typical of MEMS microphones, the membrane 901 separates a first space 905, characterized by a pressure A, from a second space 906, characterized by a pressure B.

In typical operation of a MEMS microphone the difference between pressures A and B causes the membrane to deflect. The deflection is sensed from a changing voltage across the membrane 901 and the backplate 902, which serve as capacitor plates. In an embodiment of the invention, the difference between pressures A and B in spaces 905 and 906 causes the flexible structure 913 to mechanically actuate. No input from a control mechanism is needed. The flexible structure 913 can be characterized by a mechanical stiffness, which determines what pressure differences will cause varying levels of actuation.

Embodiments of the flexible structure 913 can have different mechanical geometries, lengths, widths, thicknesses, or materials all tailored to select values of mechanical stiffness. In addition, the geometry of the ventilation opening 903, including the length and width of the flexible structure 913 strongly influence the amount of fluid flowing through the opening. The amount of fluid flowing through the opening affects how quickly the pressure difference between spaces 905 and 906 can be reduced.

FIG. 9b shows a top view of an embodiment of the MEMS structure 900 where the adjustable ventilation opening 903 is located below (or above) a backplate window 922. The backplate window 922 is located near an outer edge of the backplate 902 resembling the embodiment shown in FIGS. 1a and 1b.

With respect to embodiments of the MEMS structure with passively actuated adjustable ventilation openings, at least two particular categories of problems can be solved. These are problems related to low frequency noise and problems related to damaging high pressure events. Fixed ventilation openings can prevent damage to a membrane, but decrease the sensitivity of the microphone by limiting the bandwidth. The passive adjustable ventilation opening provides higher bandwidth and protection against damaging high pressure events. The behavior of the passive adjustable ventilation opening with respect to these two classes of problems can be described in three cases.

Case 1 pertains to a low frequency signal of moderate or low pressure (e.g., up to about 120 dB SPL). As described earlier, ventilation slots with an equivalent time constant act as high pass filters with a corner frequency. For case 1, the non-adjustable ventilation slots provide a corner frequency above the low frequency signals. With the passive adjustable ventilation opening, the relative low pressure of the signals in case 1 will not cause the ventilation openings to open. Referring again to the embodiment in FIG. 9a, there will be little reduction of pressure between space 905 and space 906. The low frequency signal can be sensed with full bandwidth.

Case 2 pertains to low frequency noise. Often relatively high pressure signals at low frequencies (e.g., noise between about 120 and 140 dB SPL having frequencies below about 100 Hz) can be encountered in typical situations. Examples of this type of noise could be wind noise when driving in a convertible or low frequency music when walking past a stereo system. However, in these cases the simultaneous detection of higher frequency signals (e.g., regular speech) by a MEMS microphone is desirable. In this case a passive adjustable ventilation opening will be self adjusted by the low frequency high pressure noise. The high pressure difference between space 905 and 906 will cause a ventilation opening to open and reduce the pressure difference. The higher frequency lower pressure signals will still excite the membrane and allow the signal to be sensed by the MEMS microphone with a decreased signal to noise ratio.

Case 3 pertains to extreme over pressure damaging signals. This is the case when the microphone is dropped or a path to the membrane is mechanically struck causing a large pressure flux to approach and impact the membrane (e.g., when a person taps a finger on a microphone input). These extreme signals can cause the microphone to fail by causing the membrane to rupture or fracture. Fixed ventilation holes can be used to protect a microphone from extreme over pressure. However, the larger the holes (and hence the better the protection against larger shocks), the higher the corner frequency of the high pass filter caused by the ventilation holes. In this way, better protection comes at the cost of reduced bandwidth.

For the passive adjustable ventilation opening the extreme over pressure events of case 3 cause the ventilation openings to self actuate from the pressure difference itself and open to reduce the pressure between space 905 and space 906. As seen in case 1, the openings do not actuate for regular pressure signals. Thus the microphone is protected from damage by extreme over pressure events, but maintains the large bandwidth needed to sense low frequency signals. It must be emphasized that the passive adjustable ventilation openings can provide the solution to the problems seen in cases 1 through 3 without any control mechanism.

The passive ventilation opening (or openings) can be the only openings provided in the membrane. Alternatively, fixed openings (e.g., small holes) could also be included. In another alternative, an actuated opening can be included in combination with the passive opening. For example, the actuated opening can be used to tune the frequency corner while the passive opening is designed to prevent damage (e.g., case 3). It is also understood that all three types could be used in the same device.

FIGS. 10a and 10b show the mechanical response of an embodiment of the invention. FIG. 10a shows the shifting of a corner frequency 1001 with a tip deflection 1002 of a passive adjustable ventilation opening as a pressure difference across the ventilation opening increases. The corner frequency shift was described earlier in FIG. 2e.

FIG. 10b shows an embodiment of a passive adjustable ventilation opening 1010 comprised of a cantilever 1011. The cantilever 1011 is shown in a deflection caused by a pressure difference between space 1012 with pressure A and space 1013 with pressure B. In the specific embodiment of FIG. 10b, a length of the cantilever 1011 could be 70 µm and a width of cantilever 1011 could be 20 µm. In other embodiments, the length of the cantilever 1011 could range from 10 to 500 µm and a width of cantilever 1011 could range from 5 to 100 µm. In another embodiment, the number of cantilevers per ventilation opening can also range from 1 to many.

Figure 11A:
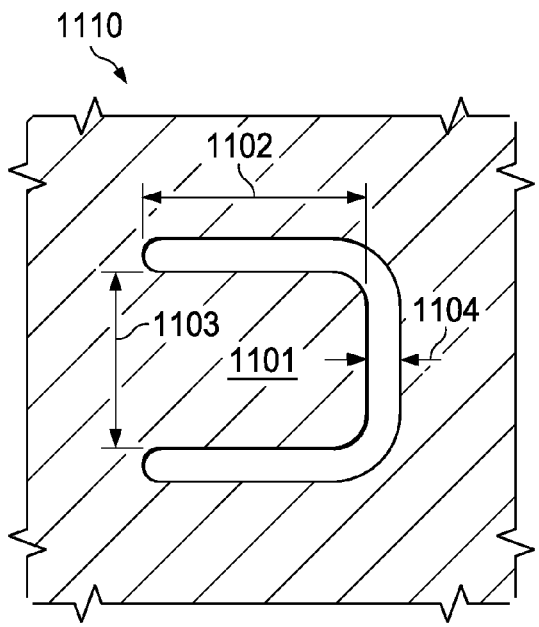
FIGS. 11a-11f each show a top view of an embodiment of an adjustable ventilation opening.

FIGS. 11a-11f show various embodiments of an adjustable ventilation opening. FIG. 11a shows an embodiment of an adjustable ventilation opening 1110 comprising a square flexible structure 1101. The flexible structure 1101 comprises a length 1102, a width 1103, and an opening gap 1104. In various embodiments, the ratio of the length to the width can range from about 1:1 to about 10:1. The opening gap 1104 is typically between about 0.5 and 5 µm.

Figure 11B:
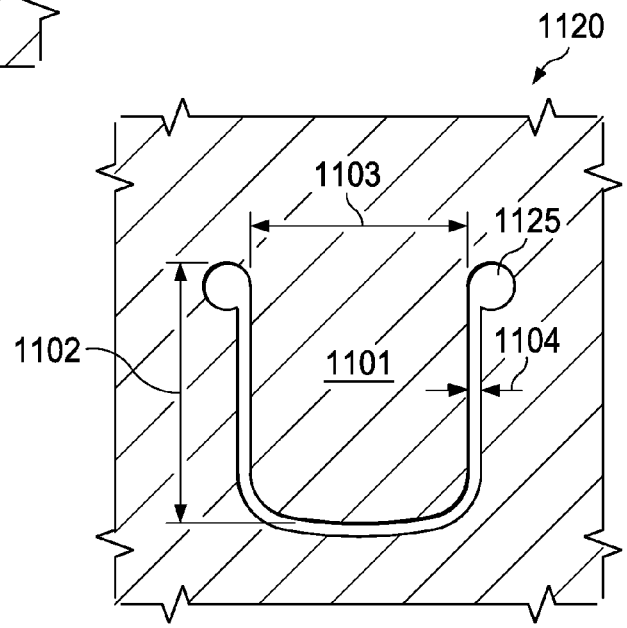

FIG. 11b shows an embodiment of an adjustable ventilation opening 1120 with small openings 1125 at ends of an opening gap 1104. These small openings 1125 at corners of a flexible structure 1101 can serve as fixed ventilation holes or can be configured to affect the mechanical stiffness of the flexible structure 1101. In an embodiment, the small openings 1125 are also meant to reduce the notching stress.

Figure 11C:
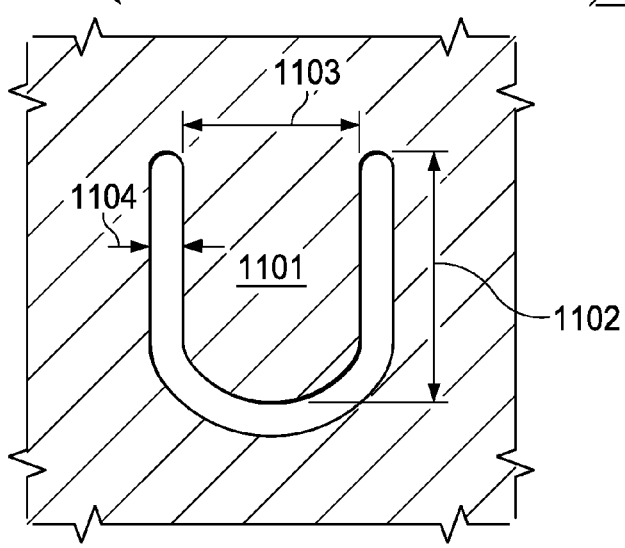

FIG. 11*c* shows an embodiment of an adjustable ventilation opening 1130 with a rounded flexible structure 1101 and opening gap 1104 separating the flap 1101 from the rest of the membrane. The shape of the flexible structure 1101 affects the air flow dynamics through the opening. The shape will alter the flow rate in the initial opening of the flexible structure (a small displacement) 1101 and in a larger opening of the flexible structure (a large displacement) 1101. Thus the shape directly effects how quickly a pressure difference reduction can be produced. In addition to round or square shapes, any other reasonable structure may be used (e.g., triangular, saw tooth, or other polygons).

Figure 11D:
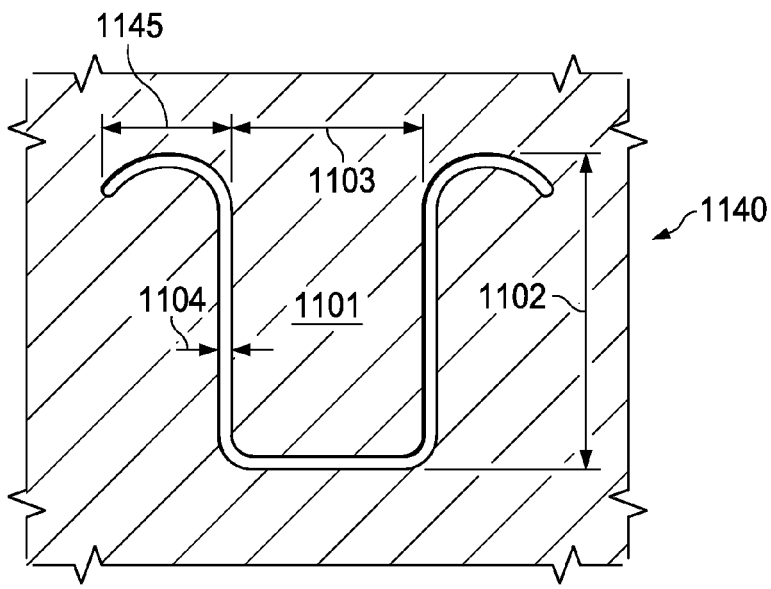

FIG. 11*d* shows an embodiment of an adjustable ventilation opening with curved openings 1145 at an end of an opening gap 1104. The curved openings can serve the purpose of releasing the notching stress from the cantilever base.

Figure 11E:
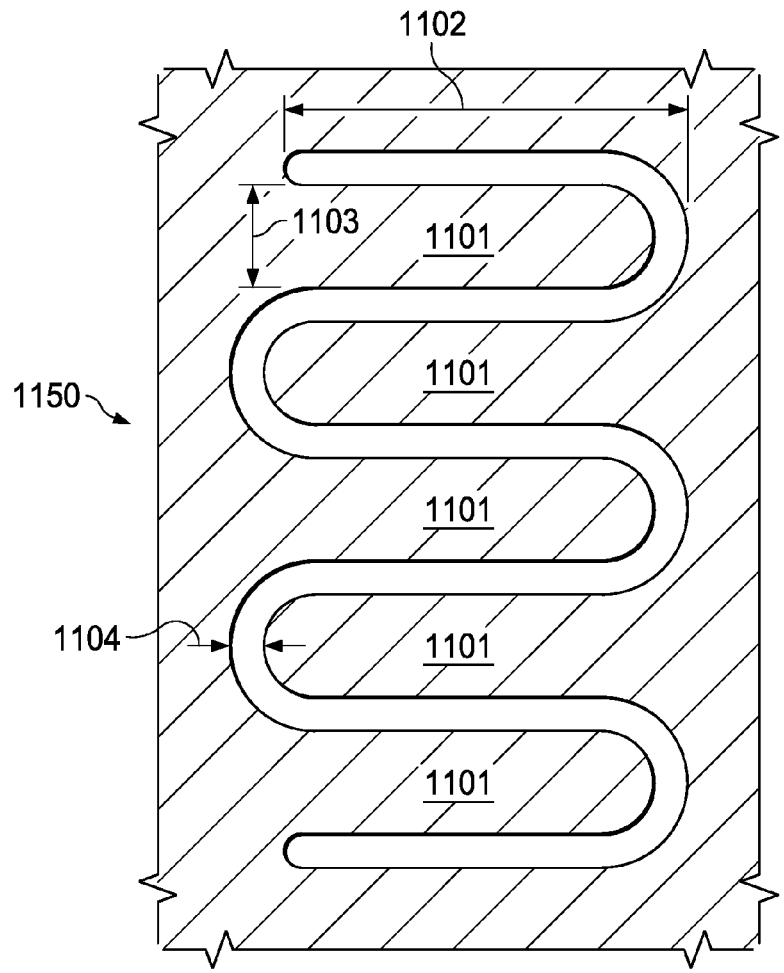

FIG. 11*e* shows an embodiment of an adjustable ventilation opening 1150 with intertwining flexible structures 1101 comprising a serpentine opening gap 1104. This structure could provide increased air flow while maintaining higher mechanical stiffness of the flexible structures 1101.

Figure 11F:
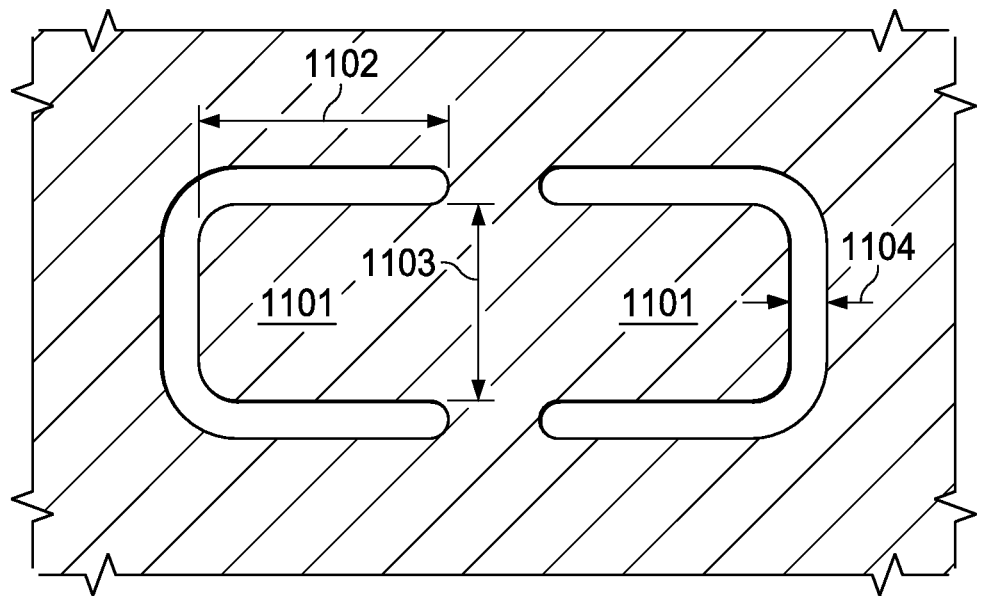

FIG. 11*f* shows an embodiment of an adjustable ventilation opening where two flexible structures 1101 with separate opening gaps 1104 are placed adjacent to one another. Additional slots 1105 are included to increase ventilation and to add flexibility to the structure. The slots 1105 reduce the stiffness of an adjustable ventilation opening 1160 and allow the whole structure to displace further. The structures 1101 could have different sizes of opening gap 1104, or the same size. The structures 1101 could have the same or different widths 1103 or lengths 1102. The adjustable ventilation opening 1160 could comprise an entire membrane or the opening could comprise a small portion of a larger membrane. The parameters will be chosen in order to improve the function of the adjustable ventilation openings and the microphone.

The embodiments in FIGS. 11*a*-11*f* are meant to show that an adjustable ventilation opening can be made in many embodiments comprising various geometries and dimensions. One or more of these various embodiments could be used together. Further it should be noted that any materials in these structures can be used. In various embodiments an adjustable ventilation opening comprises a corrugated surface and/or an anti-sticking mechanism, such as bumps and/or coatings.

In other embodiments an adjustable ventilation opening comprises thinner or thicker materials than a structure of which the adjustable ventilation opening is a part. In order to increase (by a thicker mechanical structure) or decrease (by a thinner mechanical structure) the mechanical stiffness of an adjustable ventilation opening the structural thickness of a flexible structure could be varied. In an embodiment comprising an adjustable ventilation opening on a membrane, the structure may be microfabricated using techniques commonly used in the production of MEMS or microelectronics. During the fabrication process, the flexible structure may be selectively etched (for instance through the use of photoresist to protect other regions) to produce a thinner mechanical structure. Alternatively, the flexible structure may have additional materials deposited on it or the surrounding structural materials of the membrane may be etched more than the flexible structure itself. In any of these embodiments the structural layer thickness of the flexible structure is effectively varied to produce different mechanical stiffness values and improved adjustable ventilation opening performance.

An embodiment may include multiple adjustable ventilation openings. The inclusion of more than one adjustable ventilation opening is meaningful as the corner frequency of the high pass filter scales linearly with the number of adjustable ventilation openings. Additionally, the inclusion of multiple vents reduces the risk of malfunction (e.g., caused by dirt impeding a single vent).

FIGS. 12 and 13*a*-13*d* show various embodiments of the invention with different configurations of a passive adjustable ventilation opening. Once again, the features of these various embodiments can be combined.

Figure 12:
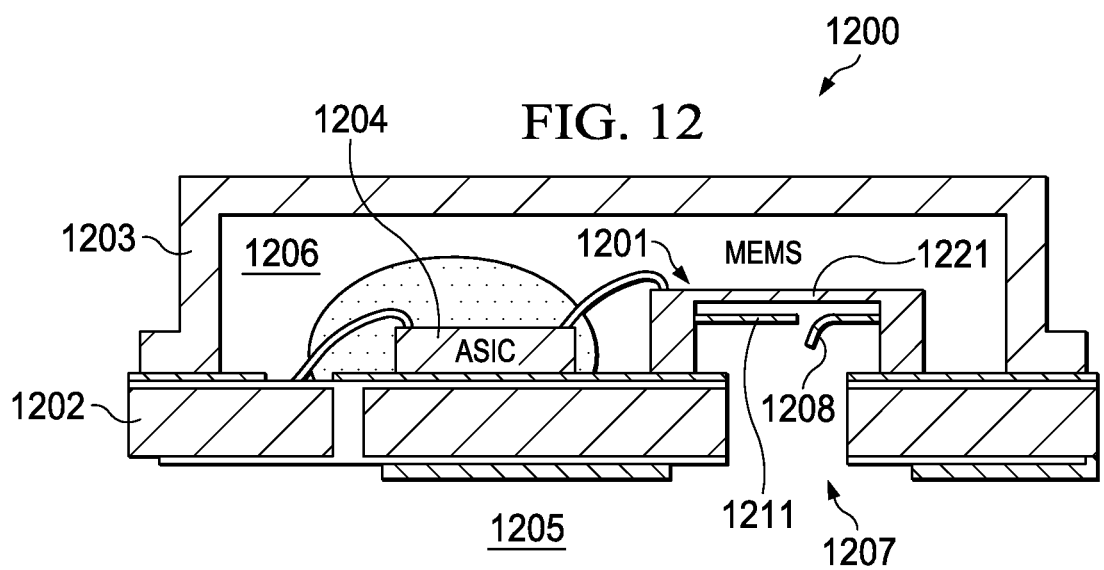
FIG. 12 shows a front view of an embodiment of the invention comprising a device housing, wherein an adjustable ventilation opening is located on a membrane.

FIG. 12 shows an embodiment with a packaged MEMS microphone 1200 in a device housing. The device housing comprises a support structure 1202 and a lid structure 1203. The support structure 1202 can, for example, be formed from a laminate such as a printed circuit board. The support structure 1202 can include electrical contacts on an inner surface to connect to the components within the housing, e.g., MEMS 1201 and ASIC (application specific integrated circuit) 1204). These contacts can be routed through the support structure 1202 to be accessed externally.

The lid 1203 can be used to enclose the components of the device 1200. In the illustrated embodiment, the lid 1203 leaves an air space over a backplate 1221. This air gap, which is at the same pressure as the space right above the membrane 1211 due to the holes in the backplate 1221, provides one of the pressures from which the pressure difference is determined. The lid 1203 can be made from metal, plastic, or laminate materials, as well as any other material appropriate for a lid structure.

A MEMS structure 1201 is attached to the support structure 1202. As described above, the MEMS structure comprises a membrane 1211 and a backplate 1221. A sound port 1207 provides a path for a pressure wave (e.g., sound signal) through the support structure 1202 to the membrane 1211.

A sense electronics block 1204 is also attached to the support structure 1202. The sense electronics block 1204 is connected to the MEMS structure 1201. The sense electronics block 1204 is configured to sense a changing voltage across the membrane 1211 and the backplate 1221. Sound signals, incident on the membrane, cause the membrane to deflect. The resulting changes in a gap distance separating the membrane 1211 and the backplate 1221 is reflected by the changing voltage across the two elements. The sense electronics block 1204 processes this changing voltage signal to provide an output signal containing the audio information of the incident sound wave.

In the specific embodiment of FIG. 12, the membrane 1211 comprises an adjustable ventilation opening 1208. The membrane 1211 separates a space 1205 with a pressure A from a space 1206 with a pressure B. The adjustable ventilation opening 1208 in one embodiment is comprised of a cantilever. The adjustable ventilation opening 1208 is mechanically actuated to deflect due to a large pressure difference A to B, or vice versa, between spaces 1205 and 1206. For pressure signals in a sense range of the MEMS structure 1201, the adjustable ventilation opening 1208 will deflect very little or none.

In various embodiments the MEMS structure 1201 may include a substrate. In various embodiments the substrate may be the support structure 1202 or a separate substrate. In other embodiments the support structure may be a printed circuit board (PCB) or a plastic or laminate structure as part of the device housing.

In still further embodiments the sound port 1207 may provide access to the membrane 1211 in space 1205 opposite the side with the backplate 1221 or the sound port 1207 may provide access to the membrane 1211 in space 1206 on the same side as the backplate 1221 (e.g., through the lid structure 1203). In that specific embodiment the space 1205 would be sealed and the sound port 1207 in the support structure 1202 would not be present.

The embodiments discussed thus far include the adjustable ventilation opening in the membrane. This is just one possible location. As will be described with respect to FIGS. 13a-13d, the ventilation opening can be located in other portions of the device.

FIG. 13a shows an embodiment of the invention where an adjustable ventilation opening 1208 is incorporated into a support structure 1202. In this case, the adjustable ventilation opening 1208 will be actuated by a pressure difference between a space 1205 and a space 1206. Although a membrane 1211 in a MEMS structure 1201 may not provide any ventilation openings, the adjustable ventilation opening 1208 in the support structure 1202 will provide a reduction of pressure needed to solve the problems of the three cases described earlier. As a part of the support structure 1202, if needed, it is possible to make the adjustable ventilation opening 1208 larger than if it was a part of the membrane 1211. The size of the hole may range from 0.1 to 1 mm and may vary in cross-sectional shape (e.g., circular, rectangular, square).

FIG. 13b shows an embodiment of the invention with a device housing 1200 wherein an adjustable ventilation opening 1208 is incorporated into a lid structure 1203. Similar to FIG. 13a, the adjustable ventilation opening 1208 provides a reduction in pressure between a space 1205 and a space 1206. The adjustable ventilation opening 1208 as located in the lid structure 1203 could come in many dimensions and configurations. Locating the opening 1208 in the lid structure 1203 provides the advantage of easy access at the top of the device housing 1200.

FIG. 13c shows an embodiment of the invention through a cross section of a MEMS structure 1201. The MEMS structure 1201 comprises a backplate 1221, a membrane 1211, a spacing layer 1209, and a support structure 1202. In an embodiment an adjustable ventilation opening 1208 is incorporated on the backplate 1221. The backplate 1221 also comprises backplate perforation holes 1210. The membrane 1211 separates a space 1205 with a pressure A from a space 1206 with a pressure B. The adjustable ventilation opening 1208 can provide a route for a pressure difference from A in space 1205 to B in space 1206 to be reduced if the pressure difference is large. The behavior of the passive adjustable ventilation opening 1208 is described by the three cases explained previously. In typical sensing the passive adjustable ventilation opening 1208 will remain closed. The spacing layer 1209 may comprise any materials. In some embodiments the spacing layer 1209 could be silicon, oxide, polymer, or some composite. In an embodiment the support structure 1202 comprises a substrate. In another embodiment the support structure 1202 comprises a printed circuit board (PCB). In a further embodiment the support structure 1202 comprises a plastic or a laminate material.

FIG. 13d shows an embodiment of the invention comprising a housing 1230. The housing 1230 comprises a device housing 1200, a sound port 1207, a pressure bypass port 1237, and an adjustable ventilation opening 1238. The device housing comprises a MEMS structure 1201, a support structure 1202, a lid structure 1203, and a sense electronics block 1204. The MEMS structure 1201 comprises a backplate 1221 and a membrane 1211. The membrane separates a space 1205 with a pressure A from a space 1206 with a pressure B. The adjustable ventilation opening 1238 separates the space 1205 from a space 1236 with a pressure C. A combination of the pressure bypass port 1237 and the adjustable ventilation opening 1238 provides a route for signals entering the sound port 1207 in space 1205 with a large pressure difference between A in space 1205 and B in space 1206 or C in space 1236 to be reduced into space 1236. This embodiment demonstrates that it is not necessary for the adjustable ventilation opening to be incorporated into the device or the MEMS structure, but can effectively function as part of the housing in various applications.

Figure 14A:
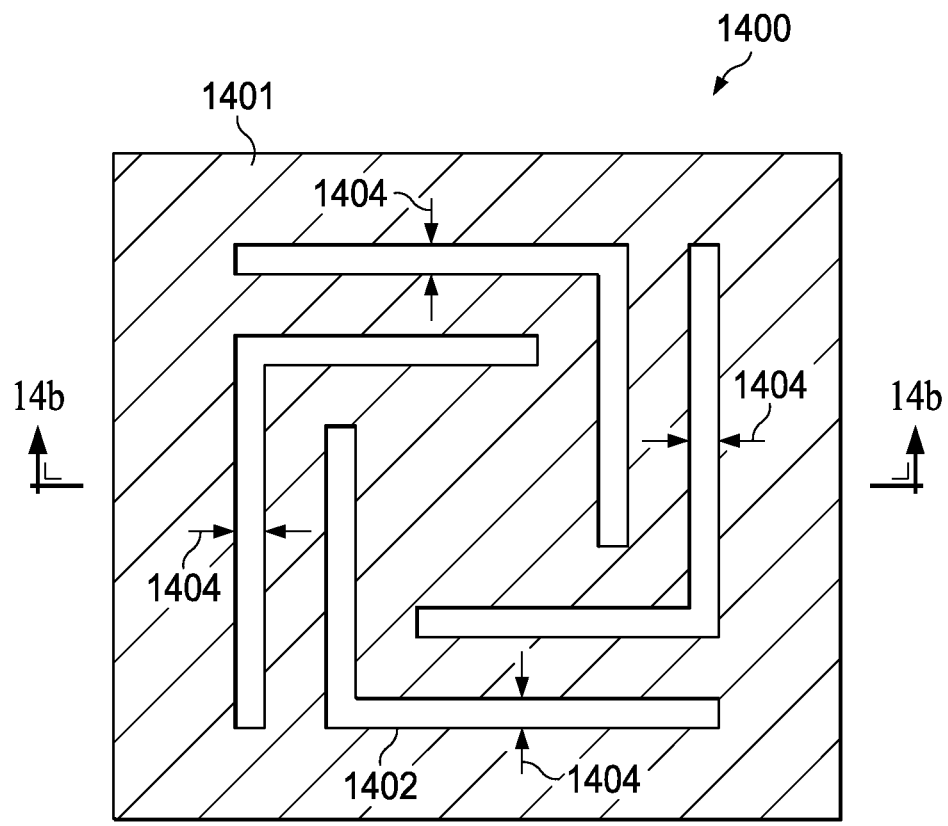
FIGS. 14a and 14b show another embodiment of the present invention.
Figure 14B:
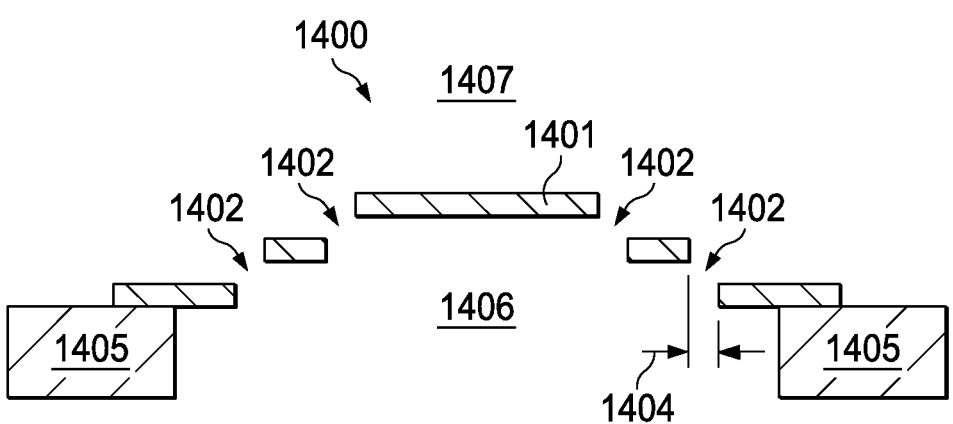

FIGS. 14a and 14b show an alternative embodiment comprising a MEMS structure 1400. FIG. 14a shows a top view of the structure 1400 comprising a membrane 1401 supported by a spring around the circumference. The spring is comprised of the membrane 1401 with slots 1402 removed from select portions. As illustrated, the cantilever is surrounded by a the spring-shaped gap such that at least two portions of the gap are adjacent a region (in this case, each side) of the cantilever. While the slots are shown connected by square corners, these corners could alternatively be rounded.

FIG. 14b shows a cross-section view taken from a cross-section 14b in FIG. 14a when the vent is in an opened position. The membrane 1401 separates the space 1406 with a pressure A from a space 1407 with a pressure B. The width of the slots 1402 is given by an opening gap 1404. The membrane 1401 is attached to a substrate 1405. In FIG. 14b the membrane is shown in large displacement where pressure A in space 1406 is much greater than pressure B in space 1407. In this case of high pressure difference, the membrane 1401 deflects further than the membrane thickness, providing greatly increased ventilation.

FIGS. 12, 13a-13d, and 14a-14b demonstrate the invention in a number of embodiments with the express intent of highlighting that an adjustable ventilation opening may be incorporated into any part of a MEMS structure, a device housing, a package, a substrate, or any part of the entire system. In these examples, the adjustable ventilation opening separates a first space which is in contact with a membrane from a second space, usually in contact with an opposite side of the membrane. The second space is not, however, required to be in contact with the opposite side of the membrane.

As one skilled in the art will recognize, an adjustable ventilation opening will often comprise a plurality of adjustable ventilation openings for better performance in the three cases previously described. Thus, specific embodiments of the invention will include a plurality of adjustable ventilation openings included in any of the structures described previously or in any combinations of the structures described previously (e.g., membranes, backplates, substrates, support structures, lid structures, housing, packaging, etc.).

Although the present invention and its advantages have been described in detail, it should be understood that various changes, substitutions and alterations can be made herein without departing from the spirit and scope of the invention as defined by the appended claims.

What is claimed is:

1. A MEMS structure comprising:
   a backplate;
   a membrane spaced a gap distance from the backplate; and
   an adjustable ventilation opening configured to reduce a pressure difference between a first space contacting a first side of the membrane and a second space contacting an opposite second side of the membrane, wherein the adjustable ventilation opening is passively actuated as a function of the pressure difference between the first space and the second space.

2. The MEMS structure according to claim 1, wherein the adjustable ventilation opening is located on the membrane.

3. The MEMS structure according to claim 2, wherein the adjustable ventilation opening is located on the membrane in a region near an edge and adjacent to a backplate window.

4. The MEMS structure according to claim 2, wherein the adjustable ventilation opening is thinner than another portion of the membrane.

5. The MEMS structure according to claim 1, wherein the adjustable ventilation opening is located on the backplate.

6. The MEMS structure according to claim 1, wherein the backplate is mechanically connected to a substrate and the adjustable ventilation opening is located on the substrate.

7. The MEMS structure according to claim 1, wherein the backplate is mechanically connected to a substrate and the substrate is mechanically connected to a support structure, the adjustable ventilation opening being located on the support structure.

8. The MEMS structure according to claim 1, wherein the first space is enclosed within a device housing and the adjustable ventilation opening is located on the device housing.

9. The MEMS structure according to claim 1, wherein the adjustable ventilation opening comprises a cantilever.

10. The MEMS structure according to claim 1, wherein the adjustable ventilation opening is one of a plurality of adjustable ventilation openings.

11. A MEMS structure comprising:
a backplate;
a membrane spaced a gap distance from the backplate; and
an adjustable ventilation opening comprising a cantilever on the membrane, the adjustable ventilation opening configured to reduce a pressure difference between a first space contacting the membrane and a second space contacting an opposite side of the membrane.

12. The MEMS structure according to claim 11, wherein the adjustable ventilation opening is passively actuated as a function of the pressure difference between the first space and the second space.

13. The MEMS structure according to claim 11, wherein the cantilever includes a tip that deflects away from a plane of the membrane by a distance that is more than four times the gap distance.

14. The MEMS structure according to claim 11, wherein the gap distance is less than 3 μm.

15. The MEMS structure according to claim 14, wherein the cantilever has a length between 10 μm and 150 μm.

16. The MEMS structure according to claim 11, wherein a ratio of a length of the cantilever to the gap distance is greater than 3.

17. The MEMS structure according to claim 11, wherein the cantilever is located on the membrane in a region near an edge and adjacent to a backplate window.

18. The MEMS structure according to claim 11, wherein the cantilever is thinner than another portion of the membrane.

19. The MEMS structure according to claim 11, wherein the cantilever is separated from remaining portions of the membrane by a U-shaped gap.

20. The MEMS structure according to claim 19, wherein the adjustable ventilation opening comprises a square-shaped flexible structure.

21. The MEMS structure according to claim 19, wherein the U-shaped gap includes opening portions extending away from top portions of the gap.

22. The MEMS structure according to claim 21, wherein the adjustable ventilation opening comprises curved openings the top portions of the gap.

23. The MEMS structure according to claim 11, wherein the adjustable ventilation opening comprise intertwining flexible structures separated by a serpentine opening gap.

24. The MEMS structure according to claim 11, wherein the adjustable ventilation opening comprises two flexible structures, each separated from remaining portions of the membrane by a U-shaped gap, wherein the two flexible structures extend in opposite directions.

25. The MEMS structure according to claim 11, wherein the cantilever is surrounded by a spring-shaped gap such that at least two portions of the gap are adjacent a region of the cantilever.

26. A MEMS device comprising:
a MEMS structure comprising a backplate and a membrane spaced a gap distance from the backplate;
a housing enclosing the MEMS structure;
a sound port acoustically coupled to the membrane; and
an adjustable ventilation opening in the housing configured to reduce a pressure difference between a first space contacting the membrane and a second space,
wherein the adjustable ventilation opening is passively actuated as a function of the pressure difference between the first space and the second space.

27. The device according to claim 26, wherein the adjustable ventilation opening comprises a cantilever.

28. The device according to claim 26, wherein the housing comprises a lid and the adjustable ventilation opening is in the lid.

29. The device according to claim 26, wherein the housing comprises a substrate and the adjustable ventilation opening is in the substrate.

30. The device according to claim 26, wherein the housing comprises a printed circuit board and the adjustable ventilation opening is in the printed circuit board.

* * * * *